(12) United States Patent
Kunze et al.

(10) Patent No.: US 8,900,654 B2
(45) Date of Patent: Dec. 2, 2014

(54) METHODS OF POLYMERIZING SILANES AND CYCLOSILANES USING N-HETEROCYCLIC CARBENES, METAL COMPLEXES HAVING N-HETEROCYCLIC CARBENE LIGANDS, AND LANTHANIDE COMPOUNDS

(75) Inventors: Klaus Kunze, Carlsbad, CA (US);
Gregory Nyce, Pleasanton, CA (US);
Wenzhuo Guo, Cupertino, CA (US)

(73) Assignee: Thin Film Electronics, Inc., Oslo (NO)

( * ) Notice: Subject to any disclaimer, the term of this patent is extended or adjusted under 35 U.S.C. 154(b) by 409 days.

(21) Appl. No.: 13/194,472

(22) Filed: Jul. 29, 2011

(65) Prior Publication Data

US 2013/0026453 A1 Jan. 31, 2013

(51) Int. Cl.
*B05D 5/12* (2006.01)
*H01L 51/00* (2006.01)
*H01B 3/18* (2006.01)
*C01B 33/04* (2006.01)
*C01B 6/06* (2006.01)

(52) U.S. Cl.
CPC .............. *C01B 6/06* (2013.01); *H01L 51/0094* (2013.01); *Y02E 10/549* (2013.01); *H01B 3/18* (2013.01); *C01B 33/04* (2013.01)
USPC ........... 427/96.1; 427/58; 252/521.3; 438/99; 528/14; 528/15; 528/16; 528/17; 528/18; 528/19

(58) Field of Classification Search
CPC ............ H01L 51/0094; H01L 51/0002; H01L 51/0034; C23C 16/42; C23C 16/30; C08G 77/00; C08G 77/60
USPC ................... 427/96.1, 58; 252/521.3; 438/99; 528/14, 15, 16, 17, 18, 19
See application file for complete search history.

(56) References Cited

U.S. PATENT DOCUMENTS

| | | | | |
|---|---|---|---|---|
| 5,087,719 | A | * | 2/1992 | Tilley et al. ................... 556/430 |
| 5,252,766 | A | * | 10/1993 | Sakakura et al. .............. 556/430 |
| 5,700,400 | A | | 12/1997 | Ikai et al. |
| 7,485,691 | B1 | | 2/2009 | Guo et al. |
| 7,491,782 | B1 | * | 2/2009 | Guo et al. ........................ 528/10 |
| 7,498,015 | B1 | * | 3/2009 | Kunze et al. ................... 423/645 |
| 7,951,892 | B1 | * | 5/2011 | Guo et al. ........................ 528/17 |
| 2007/0078252 | A1 | * | 4/2007 | Dioumaev ....................... 528/31 |
| 2008/0085373 | A1 | * | 4/2008 | Karshtedt et al. .............. 427/487 |
| 2009/0208553 | A1 | | 8/2009 | Kemp et al. |

OTHER PUBLICATIONS

Anthony J. Arduengo, III, Siegfried F. Gamper, Joseph C. Calabrese and Fredric Davidson; "Low-Coordinate Carbene Complexes of Nickel(0) and Platinum(0)"; J. Am. Chem. Soc.; 1994; pp. 4391-4394; vol. 116, No. 10; American Chemical Society, US.

Wolfgang A. Herrmann, Gisela Gerstberger and Michael Spiegler; "Nickel(II) Complexes of N-Heterocyclic Carbenes"; Organometallics; 1997; pp. 2209-2212; vol. 16, No. 10; American Chemical Society, US.

Harrison M. J. Wang and Ivan J. B. Lin; "Facile Synthesis of Silver(I)-Carbene Complexes. Useful Carbene Transfer Agents"; Organometallics; 1998; pp. 972-975; vol. 17, No. 5; American Chemical Society, US.

Anthony J. Arduengo, III, Roland Krafczyk and Reinhard Schmutzler; "Imidazolylidenes, Imidazolinylidenes and Imidazolidines"; Tetrahedron; 1999; pp. 14523-14534; vol. 55; Elsevier Science Ltd.

Benjamin R. Dible and Matthew S. Sigman; "Unusual Reactivity of Molecular Oxygen with -Allylnickel(N-heterocyclic carbene) Chloride Complexes"; J. Am. Chem. Soc.; 2003; pp. 872-873; vol. 125, No. 4; American Chemical Society, US.

Harneet Kaur, Fabiano Kauer Zinn, Edwin D. Stevens and Steven P. Nolan; "(NHC)Cu1 (NHC=N-Heterocyclic Carbene) Complexes as Efficient Catalysts for the Reduction of Carbonyl Compounds"; Organometallics; 2004; pp. 1157-1160; vol. 23, No. 5; American Chemical Society, US.

Harneet Kaur, Fabiano Kauer Zinn and Steven P. Nolan; "(NHC)Copper(I) (NHC=N-Heterocyclic Carbene) Complexes as Efficient Catalysts for the Reduction of Carbonyl Compounds"; Unpublished Report; 2004; pp. S1-S3; Department of Chemistry, University of New Orleans, New Orleans, Louisiana, US.

Mihai S. Viciu, Edwin D. Stevens, Jeffrey L. Petersen and Steven P. Nolan; "N-Heterocyclic Carbene Palladium Complexes Bearing Carboxylate Ligands and Their Catalytic Activity in the Hydroarylation of Alkynes"; Organometallics; 2004; pp. 3752-3755; vol. 23, No. 15; American Chemical Society, US.

Nevin Gurbuz, Ismail Ozdemir, Turgay Seckin and Bekir Cetinkaya; "Surface Modification of Inorganic Oxide Particles with a Carbene Complex of Palladium: A Recyclable Catalyst for the Suzuki Reaction"; Journal of Inorganic and Organometallic Polymers; 2004; pp. 149-159; vol. 14, No. 2; Plenum Publishing Corporation.

Gregory W. Nyce, Szilard Csihony, Robert M. Waymouth and James L. Hedrick; "A General and Versatile Approach to Thermally Generated N-Heterocyclic Carbenes"; Chem. Eur. J.; 2004; pp. 4073-4079; vol. 10; Wiley-VCH Verlag GmbH & Co. KGaA, Weinheim.

(Continued)

*Primary Examiner* — Douglas MC Ginty
(74) *Attorney, Agent, or Firm* — Andrew D. Fortney; Central California IP Group, P.C.

(57) ABSTRACT

Compositions and methods for controlled polymerization and/or oligomerization of silane (and optionally cyclosilane) compounds, including those of the general formulae $Si_nH_{2n}$ and $Si_nH_{2n+2}$, as well as halosilanes and arylsilanes, to produce soluble polysilanes, polygermanes and/or polysilagermanes having low levels of carbon and metal contaminants, high molecular weights, low volatility, high purity, high solubility and/or high viscosity. The polysilanes, polygermanes and/or polysilagermanes are useful as a precursor to silicon- and/or germanium-containing conductor, semiconductor and dielectric films.

31 Claims, 4 Drawing Sheets

(56) References Cited

OTHER PUBLICATIONS

Reto Dorta, Edwin D. Stevens, Natalie M. Scott, Chiara Costabile, Luigi Cavallo, Carl D. Hoff and Steven P. Nolan; "Steric and Electronic Properties of N-Heterocyclic Carbenes (NHC): A Detailed Study on Their Interaction with Ni(CO)4"; J. Am. Chem. Soc.; 2005; pp. 2485-2495; vol. 127, No. 8; American Chemical Society, US.

Ozge Aksin; "The Activity of Silica Immobilized Palladium N-Heterocyclic Carbene Complexes Toward Mizoroki-Heck Reaction and Their Characterization"; A Thesis Submitted to the Graduate School of Engineering and Sciences of Izmir Institute of Technology; Aug. 2005; 161 Pages.

Jered C. Garrison and Wiley J. Youngs; "Ag(I) N-Heterocyclic Carbene Complexes: Synthesis, Structure, and Application"; Chemical Reviews; 2005; pp. 3978-4008; vol. 105, No. 11; American Chemical Society, US.

Pierre de Fremont, Natalie M. Scott, Edwin D. Stevens, Taramatee Ramnial, Owen C. Lightbody, Charles L. B. MacDonald, Jason A. C. Clyburne, Colin D. Abernethy and Steven P. Nolan; "Synthesis of Well-Defined N-Heterocyclic Carbene Silver(I) Complexes"; Organometallics; 2005; pp. 6301-6309; vol. 24, No. 26; American Chemical Society, US.

Babak Karimi and Dieter Enders; "New N-Heterocyclic Carbene Palladium Complex/Ionic Liquid Matrix Immobilized on Silica: Application as Recoverable Catalyst for the Heck Reaction"; Organic Letters; 2006; pp. 1237-1240; vol. 8, No. 6; American Chemical Society, US.

Babak Karimi and Dieter Enders; "A New N-Heterocyclic Carbene Palladium Complex/Ionic Liquid Matrix Immobilized on Silica: Application as Recoverable Catalyst for the Heck Reaction"; Unpublished Report; 2006; pp. S1-S34.

Ozge Aksin, Hayati Turkmen, Levent Artok, Bekir Cetinkaya, Chaoying Ni, Orhan Buyukgungor and Erhan Ozkal; "Effect of Immobilization on Catalytic Characteristics of Saturated Pd-N-Heterocyclic Carbenes in Mizoroki-Heck Reactions"; Journal of Organometallic Chemistry; 2006; pp. 3027-3036; vol. 691; Elsevier B.V.

Kouki Matsubara, Keita Ueno and Youhei Shibata; Synthesis and Structures of Nickel Halide Complexes Bearing Mono- and Bis-coordinated N-Heterocyclic Carbene Ligands, Catalyzing Grignard Cross-Coupling Reactions; Organometallics; 2006; pp. 3422-3427; vol. 25, No. 14; American Chemical Society, US.

Leonel C. Silva, Pedro T. Gomes, Luis F. Veiros, Sofia I. Pascu, M. Teresa Duarte, Sonia Namorado, Jose R. Ascenso and Alberto R. Dias; "Synthesis, Structure, and Solution Dynamics of Neutral Allylnickel Complexes of N-Heterocyclic Carbenes"; Organometallics; 2006; pp. 4391-4403; vol. 25, No. 18; American Chemical Society, US.

Christopher J. O'Brien, Eric Assen B. Kantchev, Cory Valente, Niloufar Hadei, Gregory A. Chass, Alan Lough, Alan C. Hopkinson and Michael G. Organ; "Easily Prepared Air- and Moisture-Stable Pd-NHC (NHC= N-Heterocyclic Carbene) Complexes: A Reliable, User-Friendly, Highly Active Palladium Precatalyst for the Suzuki-Miyaura Reaction"; Chem. Eur. J.; 2006; pp. 4743-4748; vol. 12; Wiley-VCH Verlag GmbH & Co. KGaA, Weinheim.

Benjamin R. Dible and Matthew S. Sigman; "Steric Effects in the Aerobic Oxidation of -Allylnickel(II) Complexes with N-Heterocyclic Carbenes"; Inorganic Chemistry; 2006; pp. 8430-8441; vol. 45, No. 20; American Chemical Society, US.

William J. Sommer and Marcus Weck; "Supported N-Heterocyclic Carbene Complexes in Catalysis"; Coordination Chemistry Reviews; 2007; pp. 860-873; vol. 251; Elsevier B.V.

Serena Fantasia, Jeffrey L. Petersen, Heiko Jacobsen, Luigi Cavallo and Steven P. Nolan; "Electronic Properties of N-Heterocyclic Carbene (NHC) Ligands: Synthetic, Structural, and Spectroscopic Studies of (NHC) Platinum(II) Complexes"; Organometallics; 2007; pp. 5880-5889; vol. 26, No. 24; American Chemical Society, US.

Sang-Myung Lee, Hyo-Jin Yoon, Jong-Ho Kim, Woo-Jae Chung and Yoon-Sik Lee; "Highly Active Organosilane-Based N-Heterocyclic Carbene-Palladium Complex Immobilized on Silica Particles for the Suzuki Reaction"; Pure and Applied Chemistry; 2007; pp. 1553-1559; vol. 79, No. 9; IUPAC.

Louis-Charles Campeau, David R. Stuart and Keith Fagnou; "Recent Advances in Intermolecular Direct Arylation Reactions"; Aldrichimica Acta 2007; pp. 35-41; vol. 40, No. 2; Sigma-Aldrich Group.

Yann Schrodi and Richard L. Pederson; "Evolution and Applications of Second-Generation Ruthenium Olefin Metathesis Catalysts"; Aldrichimica Acta 2007; pp. 45-52; vol. 40, No. 2; Sigma-Aldrich Group.

Min Wang, Pinhua Li and Lei Wang; "Silica-Immobilized NHC-Cu1 Complex: An Efficient and Reusable Catalyst for A3-Coupling (Aldehyde-Alkyne-Amine) Under Solventless Reaction Conditions"; Eur. J. Org. Chem.; 2008; pp. 2255-2261; Wiley-VCH Verlag GmbH & Co. KGaA, Weinheim.

Catherine S.J. Cazin; "Recent Advances in the Design and Use of Immobilised N-Heterocyclic Carbene Ligands for Transition-Metal Catalysis"; C. R. Chimie; 2009; pp. 1173-1180; vol. 12; Elsevier Masson SAS.

Joseph C. Y. Lin, Roy T. W. Huang, Chen S. Lee, Amitabha Bhattacharyya, Wen S. Hwang and Ivan J. B. Lin; "Coinage Metal—N-Heterocyclic Carbene Complexes"; Chemical Reviews; 2009; pp. 3561-3598; vol. 109, No. 8; American Chemical Society, US.

Galmari Venkatachalam, Marion Heckenroth, Antonia Neels and Martin Albrecht; "Synthesis, Structural Diversity, and Ligand-Transfer Potential of (Carbene)copper(I) Complexes"; Helvetica Chimica Acta; 2009; pp. 1034-1045; vol. 92; Verlag Helvetica Chimica Acta, AG, Zurich.

Bin Liu, Qinqin Xia and Wanzhi Chen; "Direct Synthesis of Iron, Cobalt, Nickel, and Copper Complexes of N-Heterocyclic Carbenes by Using Commercially Available Metal Powders"; Angew. Chem. Int. Ed.; 2009; pp. 5513-5516; vol. 48; Wiley-VCH Verlag GmbH & Co. KGaA, Weinheim.

Anastas Sidiropoulos, Cameron Jones, Andreas Stasch, Susanne Klein and Gernot Frenking; "N-Heterocyclic Carbene Stabilized Digermanium(0)"; Angew. Chem. Int. Ed.; 2009; pp. 9701-9704; vol. 48; Wiley-VCH Verlag GmbH & Co. KGaA, Weinheim.

Rajendra S. Ghadwal, Herbert W. Roesky, Sebastian Merkel, Julian Henn and Dietmar Stalke; "Lewis Base Stabilized Dichlorosilylene"; Angew. Chem. Int. Ed.; 2009; pp. 5793-5796; vol. 121; Wiley-VCH Verlag GmbH & Co. KGaA, Weinheim.

Alexander C. Filippou, Oleg Chernov and Gregor Schnakenburg; "SiBr2(Idipp): A Stable N-Heterocyclic Carbene Adduct of Dibromosilylene"; Angew. Chem. Int. Ed.; 2009; pp. 5797-5800; vol. 121; Wiley-VCH Verlag GmbH & Co. KGaA, Weinheim.

Thomas Droge and Frank Glorius; "NHC—Ligand der Ideen"; Metallorganik; 2010; pp. 112-117; vol. 58; Nachrichten aus der Chemie.

* cited by examiner

Molecular weight distribution of PTTS formed using (NHC)$_2$PdCl$_2$; Mw=1580, Mn = 934

US 8,900,654 B2

METHODS OF POLYMERIZING SILANES AND CYCLOSILANES USING N-HETEROCYCLIC CARBENES, METAL COMPLEXES HAVING N-HETEROCYCLIC CARBENE LIGANDS, AND LANTHANIDE COMPOUNDS

FIELD OF THE INVENTION

The present invention relates to methods for the oligomerization and/or polymerization of silanes (as well as their germane and silagermane counterparts) to form polysilanes, polygermanes and/or polysilagermanes. The present invention also relates to compositions containing polysilanes, polygermanes and/or polysilagermanes, methods of forming a semiconductor thin film from such polysilanes, polygermanes and/or polysilagermanes, semiconductor thin films formed by such methods, and structures containing such thin films.

BACKGROUND OF THE INVENTION

Perhydropolysilanes have been studied and pursued as materials for making semiconductor films in electronics using coating and printing technologies. Different methods have been developed to make different perhydropolysilanes, such as dehydrocoupling of arylsilanes with subsequent conversion to perhydropolysilanes and polymerizing perhydrosilane monomers. There is a tremendous advantage to using oligosilanes or polysilanes for printed electronics applications, as these compositions can be formulated into inks that may be useful in a variety of solution deposition techniques to form low cost, high performance silicon devices. However, possible monomers in the polymerization of silanes (such as cyclopentasilane, $Si_5H_{10}$) to form polysilanes are not commercially available, difficult to make (especially at large scale) and hence expensive, time-consuming and/or inefficient to produce.

Hence, there is a need for catalysts and catalytic reaction processes that can convert commercially available (hydro)silanes to polysilanes economically, easily, in high yield, and high purity. Furthermore, many commercially available silane precursors may have carbon-containing groups (e.g., alkyl, aryl, etc.), which can result in unacceptably high levels of carbon impurities in films formed from inks containing polysilanes from such silane precursors. Also, oligo- and polysilanes may be prepared using metal based catalysts that may contaminate the desired product and/or require relatively lengthy or inefficient purification steps to remove metal impurities. Processes for producing electronically useful polysilanes that can utilize commercially available starting materials are desired.

SUMMARY OF THE INVENTION

Over the last 20 years, N-heterocyclic carbenes (NHC) have become important ligands in organometallic chemistry. There is a rich variety of NHC ligands synthesized to date, and their ease of preparation, combined with their unique characteristics (they are generally electron rich and can have high steric demand), make them attractive for a variety of applications. Prominent examples of their use include ruthenium-catalyzed metathesis, transition metal-catalyzed cross couplings, and stabilization of unusual metal-organic complexes.

In one aspect of the invention, N-heterocyclic carbenes (NHC) are used to efficiently catalyze polymerization of (per-hydro)silanes and/or (perhydro)cyclosilanes. The NHC catalysts used for the polymerization of silanes may be N-heterocyclic carbenes with varying organic substituents on the heterocyclic ring (e.g., N,N-diaryl and N,N-dialkyl imidazolinylidene compounds, N,N-dialkyl and N,N-diaryl imidazolylidene compounds, N,N-dialkyl and N,N-diaryl bicyclic imidazolinylidene and imidazolylidene compounds, etc.). In another aspect, the catalyst is an NHC-metal complex, which may include one or two NHC ligands bonded to a transition metal (e.g., Ag, Cu, Au, Pd, Rh, Ru, Pt, or Ni). The NHC catalyst may be used in either heterogeneous or homogeneous oligomerization and/or polymerization of silanes. Some NHC-metal complexes are commercially available (i.e., can be directly purchased from Strem or Sigma-Aldrich, Inc.; see, e.g., complex 1 in FIG. 1), while others can be prepared from commercially available materials. These catalysts can be prepared in various forms, but can be generally prepared by mixing an NHC or NHC precursor with a corresponding transition metal salt.

Also, in yet another aspect of the invention, lanthanide metal salts, compounds and complexes are active dehydrocoupling catalysts for polysilane synthesis. The present invention includes the use of low valent lanthanide compounds as catalysts or precatalysts for homogenous or heterogeneous synthesis of polysilanes. Lanthanide metal compounds can be used to polymerize monosilanes and -germanes as well as silane starting materials that have chains (which may also be branched and/or cyclic) of up to 10 or more silicon and/or germanium atoms. One embodiment of the present method uses low valent lanthanide compounds as catalysts or precatalysts, rather than conventional lanthanide hydrides and alkyl lanthanide catalyst precursors, which can be challenging and/or time-consuming to synthesize.

An object of the invention is to provide a method of making an oligosilane or polysilane, comprising combining a silane compound of the formula $A_nH_jR_k$ (e.g., a perhydrosilane of the formula $A_aH_{2a+2}$ and/or a perhydrocyclosilane of the formula $c\text{-}A_mH_{2m}$) with a N-heterocyclic carbene, an N-heterocyclic carbene-metal complex, a lanthanide metal compound, or a supported derivative thereof to form the oligosilane or polysilane, where each instance of A is independently Si or Ge, n (or a) is an integer of at least 1 (e.g., from 1 to 10, preferably from 1 to 5, and m is an integer of from 4 to 12), j+k is an integer of from n+1 to 2n+2 when n is odd and an integer from n to 2n+2 when n is even, j is an integer of at least 2, and k, which may be zero, is defined by n, j, and the number of bonding sites available on and/or the number of cyclic rings in the backbone of A atoms, and each instance of R is independently an aryl group, a halogen atom, or a pseudohalide; and removing the catalyst from the oligosilane or polysilane. In some embodiments, the oligosilane or polysilane may be made by combining a compound of the formula $A_aH_{2a+2-b}R_b$ and/or the formula $c\text{-}A_mH_{pm}R^1_{rm}$ with the N-heterocyclic carbene, N-heterocyclic carbene-metal complex, lanthanide metal compound, or supported derivative thereof to form the oligosilane or polysilane, where A, a, and m are as described above, and each instance of R and $R^1$ is independently aryl, substituted aryl, halogen, or pseudohalide; b is from 0 to 2a; p is 1 or 2, and r is 2−p. In the cases where R is aryl, the method may further comprise replacing the aryl group with a halogen or pseudohalide, and in the cases where R is a halogen or pseudohalide, the method may further comprise reducing the halogen or pseudohalide with a hydrogen source.

Another object of the invention is to provide a polysilane that includes one or more blocks defined by the formulae $\text{-}[(A_aH_{2a})_n]\text{-}$ and/or $\text{-}(c\text{-}A_mH_{(2m-2)})_q\text{-}$, where each instance of A is independently Si or Ge, a is an integer of from 1 to 100, m is an integer from 4 to 8, n*a≥15 if q=0, q≥3 if n=0, and n≥2 and q≥1 if both n and q ≠0.

A further object of the invention is to provide a composition comprising an oligosilane or polysilane consisting essentially of (i) hydrogen and (ii) silicon and/or germanium, having from 15 to 10,000, 100,000 or 1,000,000 silicon and/or germanium atoms bound to at least one other silicon and/or germanium atom, or an average chain length ranging from 15 to 1,000, 10,000 or 100,000 silicon and/or germanium atoms. In any case, the resulting oligosilanes and/or polysilanes may be linear, branched or crosslinked, and may contain essentially random linear and/or cyclic blocks, sections or chains.

Another object of the invention is to provide an ink composition comprising the above oligosilane or polysilane (e.g., which may be formed by one or more of the above methods) and a solvent, which, after coating or printing the composition (optionally with simultaneous or immediately subsequent actinic [ir]radiation) and forming a polysilane, polygermane and/or polysilagermane film, then curing, forms an amorphous, hydrogenated semiconductor film having a carbon content of not greater than 0.1 at %. In alternative embodiments, the oligosilane or polysilane in the ink composition may have one or more covalently bound chains with a total length of from 10, 15 or 25 silicon and/or germanium atoms to 10,000, 100,000 or 1,000,000 silicon and/or germanium atoms.

It is yet another object of the present invention to provide a method of forming a semiconductor film from an ink composition containing an oligosilane or polysilane as described above, comprising (1) coating or printing the ink composition onto a substrate, optionally with simultaneous and/or immediate subsequent actinic irradiation; (2) heating the coated or printed composition sufficiently to form an amorphous, hydrogenated semiconductor film; and optionally (3) annealing and/or irradiating the amorphous, hydrogenated semiconductor film sufficiently to at least partially crystallize and/or reduce a hydrogen content of the amorphous, hydrogenated semiconductor film and form the semiconductor film.

DETAILED DESCRIPTION

Reference will now be made in detail to various embodiments of the invention, examples of which may be illustrated in the accompanying drawings. While the invention will be described in conjunction with various embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise. In the present disclosure, the term "deposit" (and grammatical variations thereof) is intended to encompass all forms of deposition, including blanket deposition (e.g., CVD and PVD), coating, and printing. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The terms "oligosilane" and "polysilane" refer to compounds or mixtures of compounds that consist essentially of (1) silicon and/or germanium and (2) hydrogen, and that predominantly contain species having at least 15 silicon and/or germanium atoms. Such species may contain one or more cyclic rings. The term "(cyclo)silane" refers to compounds or mixtures of compounds that consist essentially of (1) less than 15 silicon and/or germanium atoms and (2) hydrogen, and that may contain one or more cyclic rings.

Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width). The terms "on" and "over" refer to a relationship between two features in which one feature (e.g., a layer or film) is directly on or in contact with another feature, or one or more intervening features (e.g., layers or films) may also be present between the two features.

The present polysilanes, polygermanes, and polysilagermanes (e.g., produced by one or more of the present methods) have high molecular weight, low volatility, high purity, and excellent physical properties (e.g., solubility, viscosity, etc.) for making inorganic semiconductor thin films via coating or printing (e.g., inkjet printing) a composition that includes one or more of the present polysilanes, polygermanes, and polysilagermanes. The present polysilanes are uniquely suited for making semiconductor devices (e.g., transistors, capacitors, diodes, etc.) and circuits including the same on various substrates, including but not limited to glass (e.g., quartz, borosilicate glass, etc.) sheets, wafers or slips, plastic and/or metal foils or slabs (e.g., polyimide or polyethylene sheets, or stainless steel or aluminum foils), silicon wafers, etc., all of which may carry one or more additional layers thereon (e.g., one or more dielectric, buffer, planarization and/or mechanical support layers). Applications for such films and devices (and products made therefrom on such substrates) include, but are not limited to displays (e.g., flat panel, plasma, LCD, organic or inorganic LED, etc.), RF and/or RFID devices, EAS devices, so-called "smart" tags (high frequency devices such as toll booth tags), sensors, MEMS devices, and photovoltaic cells.

The present method(s) enable controlled polymerization and/or oligomerization of linear and/or branched hydrosilanes and/or cyclic hydrosilanes (e.g., of the general formula $Si_aH_{2a+2}$ or $Si_mH_{2m}$, respectively). Exemplary starting materials include perhydrosilanes, such as silane ($SiH_4$), disilane ($Si_2H_6$), trisilane ($Si_3H_8$), tetrasilane ($Si_4H_{10}$), pentasilane ($Si_5H_{12}$), hexasilane ($Si_6H_{14}$), heptasilane ($Si_7H_{16}$), etc., and cyclohydrosilanes, such as cyclopentasilane ($Si_5H_{10}$), cyclohexasilane ($Si_6H_{12}$), silylcyclopentasilane ($H_3Si$—$Si_5H_9$), to produce a soluble perhydropolysilane-containing material for use as a precursor for forming silicon thin films with high purity, accurate thickness control, good surface smoothness, consistent density, and/or good pattern fidelity (e.g., when the film is printed or otherwise deposited on a substrate in pattern, the deposited ink will substantially retain the pattern in which it is printed). Perhydrosilanes having at least 4 Si and/or Ge atoms may be linear or branched.

The present methods can also be applied to a compound of the formula $A_aH_{2a+2-b}R_b$ and/or the formula $c\text{-}A_mH_{pm}R^1_{rm}$ to form a polysilane, where A, a, and m are as described above; each instance of R and $R^1$ is independently aryl, substituted aryl, halogen, or pseudohalide; b is an integer of from 0 to 2a; p is 1 or 2, and p+r=2. In preferred arylsilane starting compounds, R and $R^1$ are phenyl, tolyl, mesityl, or naphthyl (particularly phenyl or tolyl).

Oligosilane(s) or polysilane(s) (e.g., perhydrooligo- and/or -polysilanes) with low volatility and high molecular weight, purity, solubility and/or viscosity are suitable for forming conducting, semiconducting, or dielectric layers in electronic devices, such as thin film transistors, diodes, capacitors, etc., and applications such as displays, integrated circuits (IC), microelectromechanical systems (MEMS), sensors, radio frequency (RF) tags, and solar cells. When an arylsilane precursor is used to form oligosilane(s) and/or polysilane(s) according to the present method(s), the aryl groups are generally removed after polymerization. Thus, in embodiments where an arylsilane (e.g., of the formula $ArSiH_3$) is used as a monomer, the oligoarylsilane and/or polyarylsilane products (e.g., of the formula H—$[ArSiH]_n$—H and/or cyclo-$[ArSiH]_m$) are reacted with (i) a halogen source and (optionally) a Lewis acid or (ii) trifluoromethanesulfonic acid (HOTf), to form a polyhalosilane. The halogen atoms in the polyhalosilanes (which can also be produced from halosilane monomers by the present method[s]) can be removed by a reduction process (e.g., reacting the polyhalosilane with a hydride source such as $LiAlH_4$). Thus, it is also contemplated that aryl- and halogen-substituted silanes may also be polymerized and/or oligomerized using the present methodology, and that polyaryl- and polyhalosilanes made according to the present method(s) can be converted (e.g., by halogenation and/or reduction; see U.S. patent application Ser. Nos. 10/789,317, 11/246,014 and 11/867,587, respectively filed on Feb. 27, 2004, Oct. 6, 2005 and Oct. 4, 2007, the relevant portions of which are incorporated herein by reference) to provide high molecular weight, low volatility, high purity, high solubility and/or high viscosity perhydropolysilanes.

Silane Coupling Using N-Heterocyclic Carbene and N-Heterocyclic Carbene-Metal Complexes as Catalysts In one aspect of the present invention, NHCs and NHC-metal complexes are used to efficiently catalyze polymerization of perhydrosilanes, such as low molecular weight silanes (e.g., silane, disilane, trisilane, tetrasilane, mixtures thereof, etc.). The catalytic polymerization reactions of perhydrosilanes with N-heterocyclic carbenes are reproducible, and provide good control of the molecular weight of the reaction product. The NHC catalysts used for the polymerization of silanes may be N-heterocyclic carbenes with varying organic group substituents on the heterocyclic ring (e.g., a 5- or 6-membered saturated or unsaturated heterocyclic ring with N atoms in the 1- and 3-positions, such as an imidazol-2-ylidene, or with an N atom in the 1-position and an O or S atom in the 3-position). In other embodiments, the catalyst consists of one or more NHC ligands bonded to a transition metal (e.g., Sc, Ti, V, Cr, Mn, Fe, Co, Ni, Cu, Zn, Y, Zr, Nb, Mo, Ru, Rh, Pd, Ag, Cd, Lu, Hf, Ta, W, Re, Os, Ir, Pt, Au or Hg, particularly Ag, Cu, Au, Pd, Rh, Ru, Pt, or Ni) to form an NHC-metal complex. These NHC-metal complexes can be used alone or in combination with free NHC to catalyze the polymerization of silanes as described herein. Additionally, NHCs may be used in heterogeneous catalytic methods. Specifically, an NHC or NHC-metal complex can be immobilized on a carrier (e.g., on silica, alumina, carbon, polymer, etc.), thereby reducing or preventing the introduction of impurities from the catalyst into the silane ink (see, e.g., FIG. 3 and the corresponding discussion below).

In general, one method of forming an oligosilane or polysilane includes combining a silane compound of the formula $A_aH_{2a+2}$ and/or a cyclosilane compound of the formula $A_mH_{2m}$ with an NHC catalyst (e.g., a bis(1,3-diaryl)-, bis(1,3-dialkyl)- or bis(1,3-diaralkyl)imidazolinylidene compound) and/or an NHC-metal complex to form the oligosilane or polysilane, where each instance of A is independently Si or Ge, a is an integer of at least 1 (e.g., 1-12, preferably 1-5), and m is an integer of from 4 to 12 (preferably 4-6); and removing the catalyst from the oligosilane or polysilane. In examples where a is relatively large (e.g., an integer of at least 5), the method may be one in which an oligo- or polysilane is crosslinked by the catalyst to form a larger oligo- or polysilane. In other embodiments, the NHC and/or NHC-metal complex may be used to catalyze polymerization reactions between linear, branched, and/or cyclic polysilanes (e.g., polysilanes comprising blocks of repeating units of $A_aH_{2a}$, $A_nH_jR_k$, and/or cyclo-$A_mH_{2m-2}$) comprising more than 12 A atoms (e.g., 13-500 A atoms, 50-150 A atoms, or any value or range of values therein) to form even larger polysilanes. Examples of NHCs that may be used as catalysts in the presently disclosed methods include 1,3-diphenylimidazol-2-ylidene, 1,3-di-o-tolylimidazol-2-ylidene, 1,3-di-o,o'-xylylimidazol-2-ylidene, 1,3-dimesitylimidazol-2-ylidene, 1,3-dimethylimidazol-2-ylidene, 1,3-diethylimidazol-2-ylidene, 1,3-diisopropylimidazol-2-ylidene, 1,3-diisobutylimidazol-2-ylidene, 1,3-di-t-butylimidazol-2-ylidene, 1,3-di-t-butyl-4,5-dihydro1H-imidazol-2-ylidene, 1,3-bis(1-adamantanyl)imidazol-2-ylidene, N,N'-(2,4,6-trimethylphenyl)dihydroimidazol-2-ylidene, N,N'-(2,6-diisopropylphenyl)dihydroimidazol-2-ylidene, and derivatives thereof.

One major advantage of using NHC and NHC-metal complex catalysts is that they are capable of polymerizing small linear silanes, such as $Si_4H_{10}$ (e.g., n-tetrasilane, isotetrasilane, or a mixture of n-tetrasilane and isotetrasilane, which may have a molar ratio of from 1:100 to 100:1 [e.g., 75:25]), $Si_3H_8$, or, potentially, $Si_2H_6$ and $SiH_4$. Some of these monomers are commercially available (e.g., trisilane [$Si_3H_8$] is available from SAFC Hitech through Sigma-Aldrich, Inc. [CAS Number 7783-26-8], and from Voltaix, which produces electronic grade trisilane and tetrasilane [$Si_4H_{10}$; CAS Number 7783-29-1]), thus simplifying and reducing the cost and time required to form inorganic conductor, semiconductor, or dielectric films (e.g., comprising a Group IVA element, such as silicon and/or germanium, which may be oxidized to form a dielectric film or which may be highly doped to form a conductive film) using a liquid silane composition (e.g., printing or coating an oligo- or polysilane ink over a substrate to form a silicon film). Since cyclic silanes (such as $c\text{-}Si_5H_{10}$)

are not commercially available and are generally challenging to make and purify to electronic-grade quality, the present method offers a route to polysilane materials from relatively low molecular weight silanes that is cheaper and that produces materials of potentially higher purity than other approaches. In addition, the present method may provide (i) better control of the product molecular weight distribution and (ii) much wider molecular weight range than other polymerization methods, and may provide oligosilanes and/or polysilanes with greater stability (neat and/or in solution), longer shelf life (e.g., at a variety of temperatures and/or other storage conditions), and improved solubility. NHC and NHC-metal complex catalysts can efficiently polymerize fully hydrogenated silanes, obviating further steps (e.g., post-polymerization or post-reduction) for converting the polymeric material into a polyhydrosilane. This minimizes the chances of introducing contaminants into the system, particularly metal, carbon, oxygen, and other impurities, and provides a simplified process with better scalability to larger manufacturing capacities for commercial purposes.

The NHC and NHC-metal complex catalysts described herein may be used under a wide variety of different reaction conditions to catalyze the polymerization of relatively small molecular weight silanes. NHC and NHC-metal complex catalysts can polymerize silanes in both the liquid and gas phases. Additionally, the NHC and NHC-metal complex catalysts can polymerize relatively small molecular weight silanes at standard conditions (e.g., room temperature and 1 atm pressure), or at an elevated or reduced pressure and/or temperature. For instance, NHC catalysts may be used to polymerize disilane at a temperature below the boiling point of disilane (−14° C.), at a pressure of 1 atm or greater.

The use of NHC catalysts (NHCs not complexed with a metal) is also advantageous for producing polysilanes because NHCs are metal-free catalysts, which avoids the potential introduction of metal contaminants into the final product. Methods utilizing NHC catalysts can provide polysilanes and/or inorganic conductor, semiconductor and dielectric films in applications that require ultra-low levels of metal impurities (e.g., solar applications).

Figure 3:
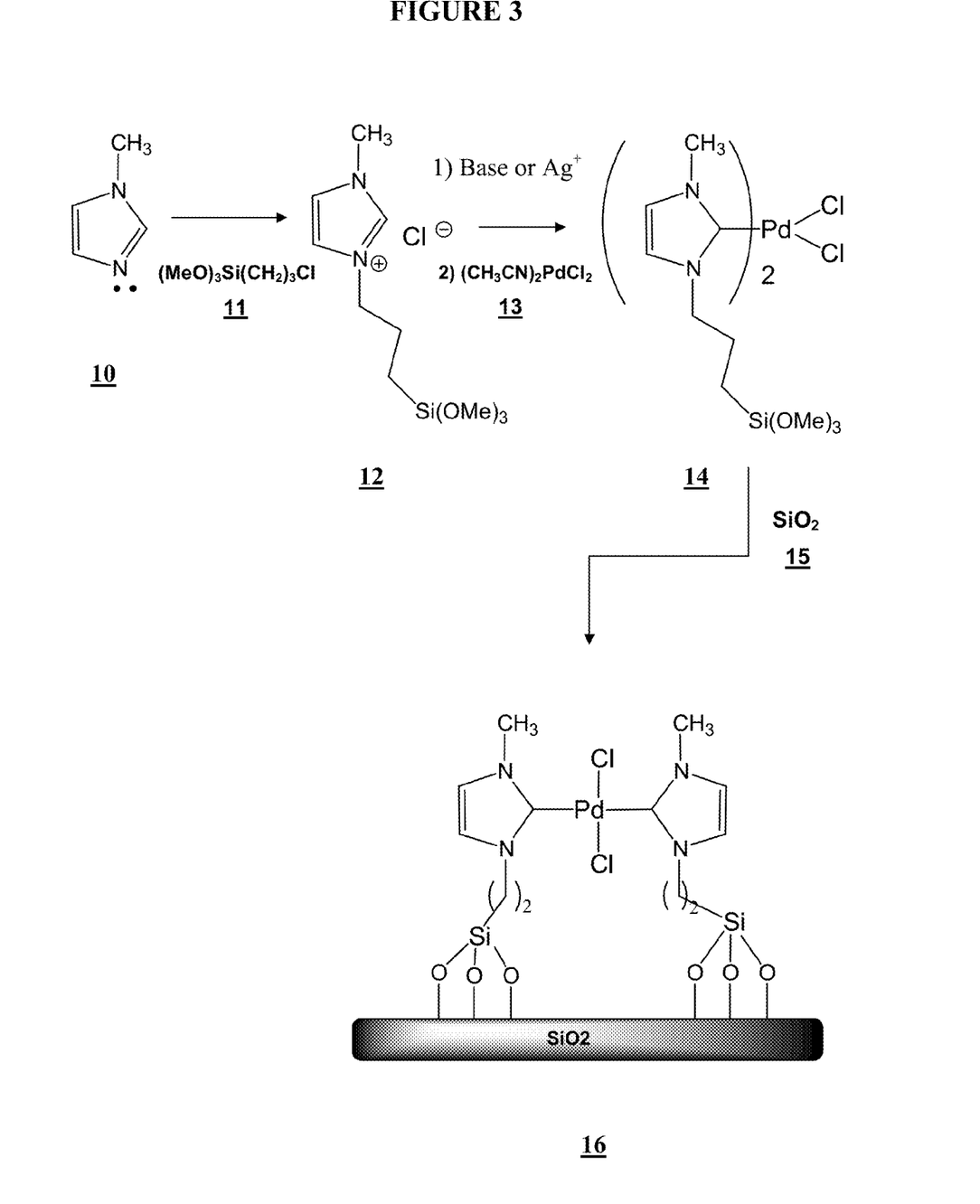
FIG. 3 is a diagram illustrating the steps of an exemplary scheme for synthesizing an N-heterocyclic-palladium complex attached to silica as a support medium.

Additionally, NHC or NHC-metal complexes can be immobilized on a carrier (e.g., on silica, alumina, carbon, a polymer, etc.) to facilitate polymerization without introducing catalyst impurities into the resulting polysilane (see, e.g., FIG. 3). Substantially all of the NHC or NHC-metal complex (e.g., the Pd complex 16 shown in FIG. 3) may be immobilized on a carrier (e.g., a $SiO_2$ layer) by the process shown in FIG. 3. For example, an N-alkyl imidazole such as 1-methyl-1,3-imidazole 10 may be reacted with a haloalkyl trialkoxysilane such as (3-chloropropyl)trimethoxysilane 11 to form a (trialkoxysilyl)alkylimidazolium salt (e.g., 12). Subsequent activation of 12 with base or a silver reagent (e.g., a silver salt of $Ag_2O$), followed by transfer to a transition metal (e.g., by stirring in a mixture or solution) such as bis(acetonitrile) palladium dichloride 13 forms the trialkoxysilyl-NHC-transition metal complex (e.g., 14 in FIG. 3). The trialkoxysilyl-NHC-transition metal complex may be reacted directly with activated silica to form the supported trialkoxysilyl-NHC-transition metal complex (e.g., 16). Optionally, an activator and/or catalyst (e.g., a mild and/or buffered acid such as acetic acid or ammonium toluenesulfonate) may be used, as long as it does not affect the basic structure of the NHC-transition metal complex. However, a minor amount of the NHC or NHC-metal complex may not bind completely or fully to the carrier due to a less than complete reaction between the NHC or NHC-metal complexes and the carrier. For example, the $Si(OMe)_3$ "linker" groups in species 12 and/or 14 attached to the NHC or NHC-metal complexes may not exhibit 100% reaction efficiency with the carrier material, and one or two of the Si—O-Me groups may remain after the substrate-linking reaction. Also, the NHC-metal complex may include only a single NHC ligand containing linker groups. However, the single NHC ligand containing linker groups is generally sufficient to substantially anchor the NHC-metal complex to the substrate or carrier. Because the carbon-based NHC catalysts are anchored to a carrier (e.g., in compound 16), they generally do not leach into or otherwise contaminate the reaction mixture. Anchored NHC catalysts such as 16 are also easy to remove from reaction mixture by filtration or other mechanical means (e.g., decanting, centrifuging, etc.). Thus, carrier-supported NHC and NHC-metal complex catalysts provide a general platform for silane polymerization catalysts with minimal metal or carbon contamination in the final polysilane product.

The use of NHC or NHC-metal complex catalysts supported on a substrate for use in a heterogeneous catalysis has significant economical advantages, as well. These supported catalysts can be advantageously employed in a process comprising passing very small molecular weight silanes such as monosilane, disilane or trisilane in gas phase over the supported catalyst, optionally under high pressure (e.g., at least 5 or 10 atm, up to 15, 20 or 30 atm) or autoclave conditions. Liquid phase and/or lower volatility polysilanes may be recovered as a product from such reactions. Higher molecular weight silane monomers (e.g., tetrasilane, pentasilane, etc.) may also be polymerized by passing them over the supported catalyst in the gas phase at elevated temperatures and/or reduced pressures. Of course, the supported NHC catalysts may also be used to polymerize silane monomers, oligomers and even relatively small polymers in the liquid phase (e.g., at room temperature or at an elevated temperature).

Very recently, it has been shown that reactions of NHCs with trichlorosilane ($HSiCl_3$) yield the corresponding monomeric silylenes (e.g., $SiCl_2$; Ghadwal et al., *Angew. Chem.* 2009, 121, 5793-5796) under abstraction of (NHC)HCl. Dichlorosilylene can also be obtained by reduction of the corresponding NHC—$SiCl_3^+$ $Cl^-$ with $KC_8$ (Ibid.). In the case of dichlorosilylene, because of its strong sigma donor characteristics (e.g., of the singlet carbene in the NHC), the NHC also acts as a stabilizing ligand. These features make the use of NHCs and NHC-metal complexes as catalysts for silane polymerization an effective alternative to other silane polymerization approaches that involve post-polymerization chemistry (e.g., dephenylation of polyphenylsilane) and/or organometallic catalysts that can introduce carbon- and/or other impurity-containing ligands into the polysilane. The corresponding dichloro- and dibromogermylenes are also known (Sidiropoulos et al., *Angew. Chem. Int. Ed.,* 2009, 48, 9701-9704; Filippou et al., *Angew. Chem.,* 2009, 121, 5797-5800).

NHCs can stabilize compounds with Ge, B, P and Si double bonds (see, e.g., Wang et al., *Science*, vol. 321, Aug. 22, 2008; Sidiropoulos et al., *Angew. Chem. Int. Ed.,* 2009, 48, 9701-9704; the relevant portions of both of which are incorporated herein by reference). Thus, in a further embodiment of the present invention, NHCs stabilize compounds having even lower valent A=A bonds or D=D bonds with lone pairs on the elements (or H atoms when D is boron), where A is Si or Ge, and D is P, As, Sb or B (e.g., compounds of the formula $[NHC]_2[A_2]$, $[NHC]_2[D_2]$ or $[NHC]_2[HB=BH]$). Such precursors are particularly interesting as a soluble Si, Ge or dopant sources for the deposition of Si, Ge or doped Si and/or Ge films with low or no hydrogen content. In cases other than where D is boron, no dehydrogenation cure is necessary to form a polycrystalline semiconductor film by laser crystallization, because there is no hydrogen attached to the A or D atoms. Of course, the NHC should dissociate from the $A_2$ and/or $D_2$ species and be removed cleanly, without decomposition, during thin film curing.

Below, methods of polymerizing perhydrosilanes (e.g., trisilane, tetrasilane, cyclopentasilane, etc.) using NHC and NHC-metal catalysts are described. These new NHC-based catalysts are very active, and their synthesis is straightforward and reproducible. Polymerization using NHC-based catalysts may provide a more efficient means for producing low-carbon and low-metal contaminant oligo- and polysilanes that may be used in new silane precursor inks for depositing and forming silicon and germanium films in electronic devices.

In one embodiment of the method, the starting silane compound is combined with an NHC catalyst or an NHC-metal complex. The catalyst may be combined with a silane or germanium monomer in an amount of 0.001-10 mmol of catalyst per mol of silane/germane monomer, or any range of values therein. Alternatively, the catalyst may be present in a ratio of 1 NHC molecule or metal atom per 100-1,000,000 Si and/or Ge atoms of monomer (e.g., 0.0001 to 1 atomic %, or any value or range of values therein).

The NHC catalyst can be an imidazol-2-ylidene, an imidazolin-2-ylidene, a benzimidazol-2-ylidene or other aryl imidazol-2-ylidene, a triazolylidene, a thiazolylidene, an aryl thiazolylidene (e.g., a benzothiazolylidene), a pyrrolidinylidene, an aryl dihydropyrimidinylidene (e.g., a 1,8-naphthadiyldihydropyrimidinylidene), or a tetrahydropyrimidinylidene, any of which may be substituted with one or more of the following groups: $C_1$-$C_6$ alkyl which may be substituted with one or more halogen, $C_1$-$C_4$ alkoxy, di-$C_1$-$C_4$-alkylamino, $C_1$-$C_4$ alkylthio or $C_6$-$C_{10}$ arylthio groups; $C_3$-$C_8$ cycloalkyl which may be substituted with one or more halogen, $C_1$-$C_4$ alkyl or $C_1$-$C_4$ haloalkyl groups; $C_6$-$C_{12}$ aryl which may be substituted with one or more $C_1$-$C_4$ alkyl, $C_1$-$C_4$ haloalkyl, halogen, pseudohalide, $C_1$-$C_4$ alkoxy, di-$C_1$-$C_4$-alkylamino, $C_1$-$C_4$ alkylthio or $C_6$-$C_{10}$ arylthio groups; $C_7$-$C_{13}$ aralkyl which may be substituted with one or more $C_1$-$C_4$ alkyl, halogen, $C_1$-$C_4$ alkoxy, or di-$C_1$-$C_4$-alkylamino groups; halogen or pseudohalide; $C_1$-$C_6$ alkoxy which may be substituted with one or more $C_1$-$C_4$ alkoxy or $C_1$-$C_4$ alkoxy-$C_1$-$C_4$ alkyleneoxy; or adamantyl, di-$C_1$-$C_6$-alkylamino, di-$C_6$-$C_{12}$-arylamino, $C_1$-$C_6$ alkylthio, or $C_6$-$C_{12}$ arylthio groups. For example, the NHC catalyst can be a 1,3-disubstituted imidazolylidene, a 1,3-disubstituted imidazolinylidene, a 1,3-disubstituted benzimidazol-2-ylidene, a 1,3-disubstituted triazolylidene, an N-substituted thiazolylidene, a 1,3,3-trisubstituted pyrrolidinylidene, or a 1,3-disubstituted tetrahydropyrimidinylidene. Examples of NHCs that may be used as catalysts in the presently disclosed methods include 1,3-diarylimidazolin-2-ylidenes (e.g., 1,3-diphenylimidazolin-2-ylidene, 1,3-dimesitylimidazolin-2-ylidene, 1,3-bis[2,6-diisopropylphenyl]imidazolin-2-ylidene, etc.), 1,3-diaralkylimidazolin-2-ylidenes (e.g., 1,3-dibenzylimidazolin-2-ylidene), 1,3-diarylimidazol-2-ylidenes (e.g., 1,3-diphenylimidazol-2-ylidene, 1,3-dimesitylimidazol-2-ylidene, 1,3-bis[2,6-diisopropylphenyl]-imidazol-2-ylidene, etc.), 1,3-dialkylimidazol-2-ylidenes (e.g., 1,3-diisopropylimidazol-2-ylidene, 1,3-di-t-butylimidazol-2-ylidene, etc.), 1,3-bis(1-adamantanyl)imidazol-2-ylidene, 1,3-dialkylimidazolin-2-ylidenes (e.g., 1,3-di-t-butylimidazolin-2-ylidene), and derivatives thereof.

Figure 1:
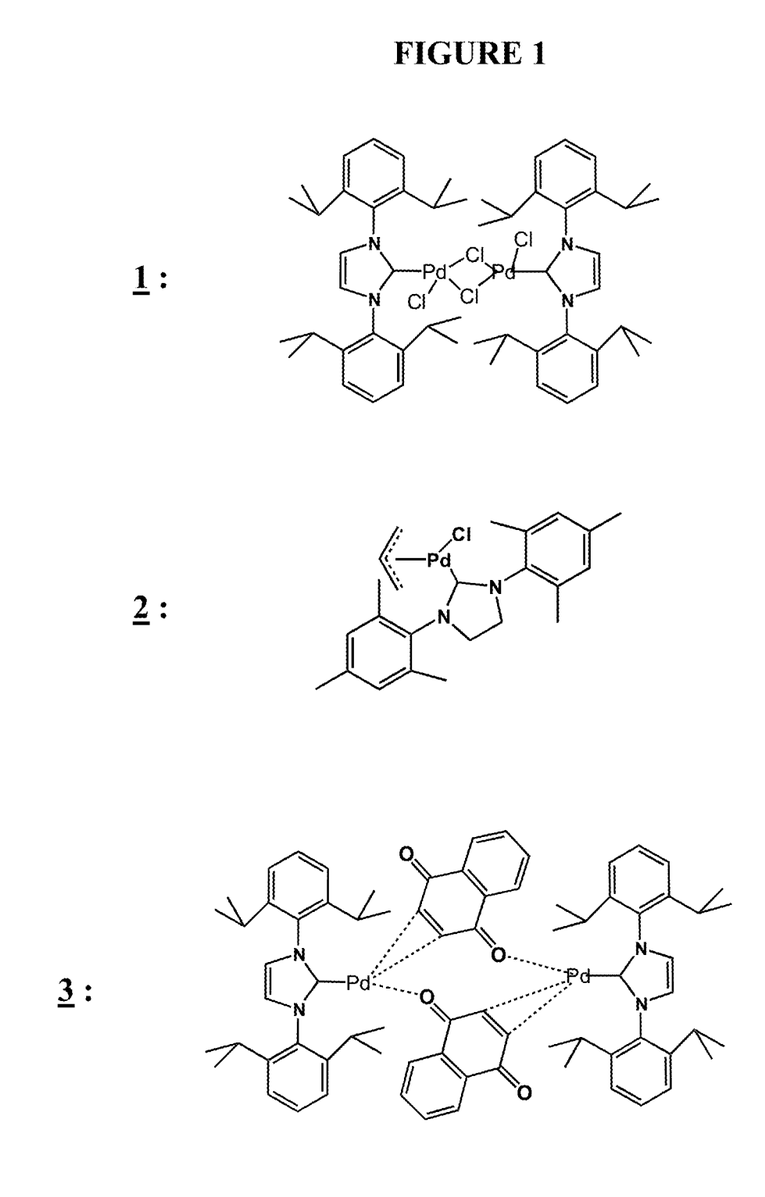
FIG. 1 is a diagram showing examples of commercially available N-heterocyclic carbene-metal complexes that can be used for silane polymerization.

In another embodiment, the catalyst may be an NHC complexed with a transition metal. The NHC-metal complex may include one or two NHCs (as discussed above) and a transition metal selected from the group consisting of Ag, Cu, Au, Pd, Rh, Ru, Pt, and Ni. Some NHC-metal complexes are commercially available (e.g., compounds 1, 2 and 3 in FIG. 1 are commercially available from Strem Chemicals, Inc., Newburyport, Mass.). Similar Pd NHC catalysts are commercially available from Sigma Aldrich, St. Louis, Mo. (e.g., 1,3-bis(2,4,6-trimethylphenyl)imidazol-2-ylidene (1,4-naphthoquinone)palladium(0) dimer, allyl[1,3-bis(mesityl)imidazol-2-ylidene]palladium chloride, and allyl[1,3-bis(2,6-diisopropylphenyl)-imidazol-2-ylidene]palladium (II) chloride). Another NHC-noble metal catalyst, 1,3-bis(2,6-diisopropylphenyl)imidazol-2-ylidene(acetonitrile)gold(I) tetrafluoroborate, is commercially available from Strem Chemicals, Inc. Other NHC-metal catalysts may be prepared from commercially available NHCs. For example, NHC-metal complexes may be prepared by reacting an NHC with a transition metal salt. In one instance, an NHC may be reacted with a metal compound of the formula $MX_{y'}$, where M is a transition metal such as Ag, Cu, Au, Pd, Rh, Pt, or Ni; y is 1, 2 or 3; and each instance of X is independently halogen, a pseudohalide, or a substituted or unsubstituted $C_1$-$C_6$ alkoxy, $C_1$-$C_6$ aralkoxy, di-$C_6$-$C_{12}$-arylamino, di-$C_1$-$C_6$-alkylamino, $C_1$-$C_6$ alkylthio, or $C_6$-$C_{12}$ arylthio, to yield an NHC-metal complex of the formula $[M(NHC)_x X_{y'}]_z$, where x is 1 or 2, y' is 1 or 2, and z is 1 or 2 (see the example in FIG. 1).

Figure 2:
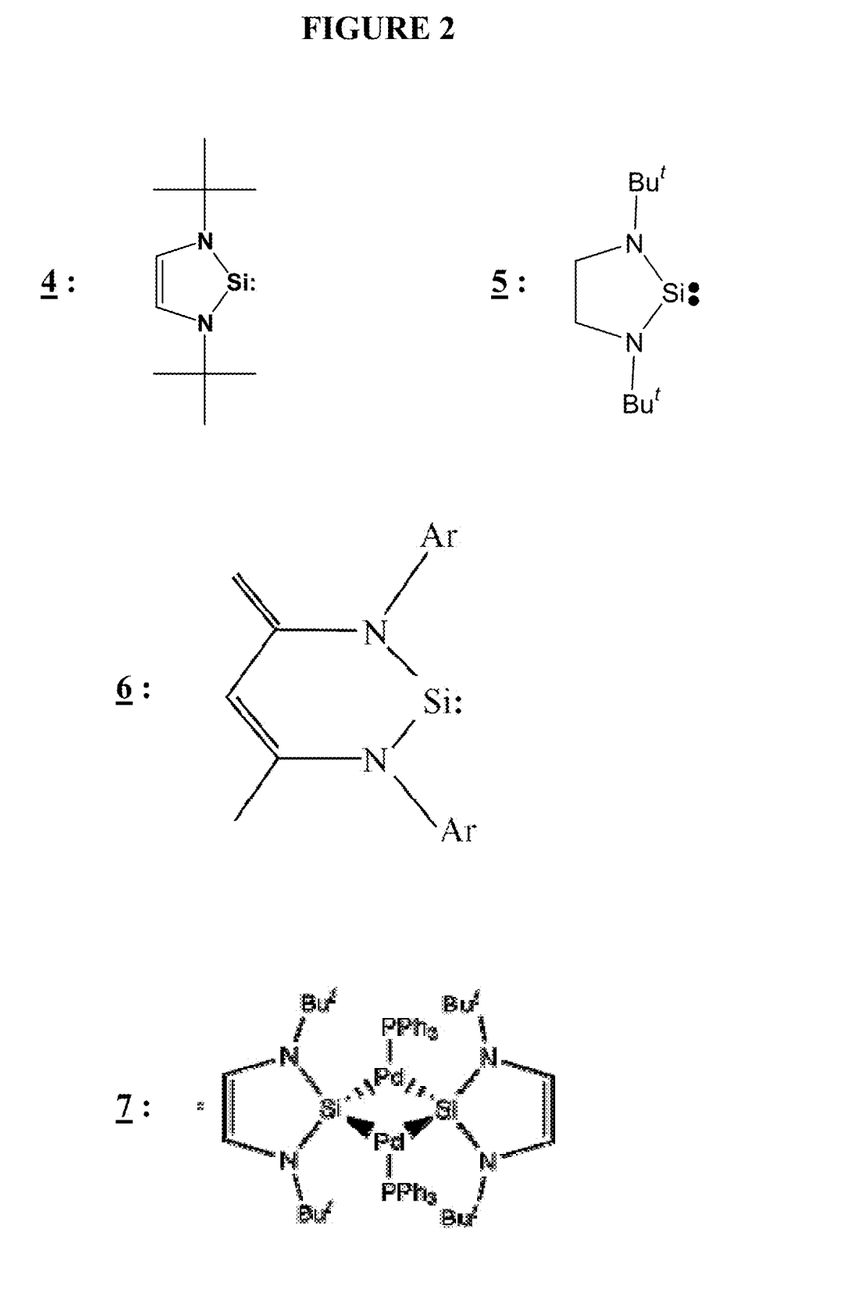
FIG. 2 is a diagram showing examples of known, stable N-heterocyclic silylenes and an N-heterocyclic silylene-metal complex that can be used for silane polymerization.

In a further aspect of the present method, the catalyst is an N-heterocyclic silylene (NHS) or an N-heterocyclic germylene (NHG). N-heterocyclic silylenes are generally stable at room temperature. As a result, substantially any silylene or germylene analog of the N-heterocyclic carbenes described herein can be made and used. For example, the NHS catalyst can be an imidazol-2-silylene, an imidazolin-2-silylene, a benzimidazol-2-silylene or other aryl imidazol-2-silylene, a triazolesilylene, a thiazolesilylene, an aryl thiazolesilylene (e.g., a benzothiazolesilylene), a pyrrolidinesilylene, an aryl dihydropyrimidinesilylene (e.g., a 1,8-naphthadiyldihydropyrimidinesilylene), or a tetrahydropyrimidinesilylene, any of which may be substituted with one or more of the following groups: $C_1$-$C_6$ alkyl which may be substituted with one or more halogens, $C_1$-$C_4$ alkoxy, di-$C_1$-$C_4$-alkylamino, $C_1$-$C_4$ alkylthio or $C_6$-$C_{10}$ arylthio groups; $C_3$-$C_8$ cycloalkyl which may be substituted with one or more halogen, $C_1$-$C_4$ alkyl or $C_1$-$C_4$ haloalkyl groups; $C_6$-$C_{12}$ aryl which may be substituted with one or more $C_1$-$C_4$ alkyl, $C_1$-$C_4$ haloalkyl, halogen, pseudohalide, $C_1$-$C_4$ alkoxy, di-$C_1$-$C_4$-alkylamino, $C_1$-$C_4$ alkylthio or $C_6$-$C_{10}$ arylthio groups; $C_7$-$C_{13}$ aralkyl which may be substituted with one or more $C_1$-$C_4$ alkyl, halogen, $C_1$-$C_4$ alkoxy, or di-$C_1$-$C_4$-alkylamino groups; halogen or pseudohalide; $C_1$-$C_6$ alkoxy which may be substituted with one or more $C_1$-$C_4$ alkoxy or $C_1$-$C_4$ alkoxy-$C_1$-$C_4$ alkyleneoxy; or adamantyl, di-$C_1$-$C_6$-alkylamino, di-$C_6$-$C_{12}$-arylamino, $C_1$-$C_6$ alkylthio, or $C_6$-$C_{12}$ arylthio groups. The NHS catalyst can, in various instances, be a 1,3-disubstituted imidazol-2-silylene, a 1,3-disubstituted imidazolin-2-silylene, a 1,3-disubstituted benzimidazol-2-silylene, a 1,3-disubstituted triazolesilylene, an N-substituted thiazolesilylene, a 1,3,3-trisubstituted pyrrolidinesilylene, or a 1,3-disubstituted tetrahydropyrimidinesilylene. Specific examples of N-heterocyclic silylenes that may be used as catalysts in the presently disclosed methods are shown in FIG. 2, and include 1,3-di-t-butylimidazol-2-silylene 4, 1,3-di-t-butylimidazolin-2-silylene 5, and the six-membered species 6.

Similarly, the catalyst in the present methods may also be a transition metal complex of an N-heterocyclic silylene (NHS) or an N-heterocyclic germylene (NHG). NHS-transition metal complexes are also generally stable at room temperature. As a result, substantially any silylene or germylene analog of the NHC-metal complexes described herein can be made and used. A specific example of an N-heterocyclic silylene-transition metal complex that may be used as a catalyst in the presently disclosed methods is shown in FIG. 2, and includes bis-(1,3-di-t-butylimidazol-2-silylene) bis-(triphenylphosphine) dipalladium 7.

In another embodiment, the NHC and NHC-metal complexes catalysts may be supported on silica, alumina, a silicate, an aluminate, an aluminosilicate (e.g., a zeolite), carbon, polymer gel or beads, or other stationary phases. Bonding the catalyst to a stationary support allows the catalyst to be more efficiently removed from the polysilane product. Catalysts bonded to a support can be easily filtered out of the polysilane solution after polymerization has been carried out (see discussion of the filtering process below) or removed by other mechanical means (e.g. decanting, centrifuging, etc.). As a result, the purity of the resulting polysilanes may be further enhanced by using supported catalysts.

In embodiments where the catalyst is attached to a support (e.g., silica, alumina, silicate, aluminate, aluminosilicate, or other stationary phase) prior to polymerization, the catalyst may be loaded on the support in an amount of from 0.001 mmol/mg to 0.5 mmol/mg of the support. For example, an NHC-metal catalyst may be attached to silica in a ratio providing from 0.04 to 0.1 mmol of NHC or metal per mg of silica.

In preferred embodiments, the silane monomer compound has the formula $A_aH_{2a+2}$, wherein each instance of A is independently Si or Ge (A is Si in preferred embodiments), a is preferably an integer of from 1 to 12, especially from 1 to 5. In preferred embodiments, the silane monomer may be trisilane ($Si_3H_8$), tetrasilane ($Si_4H_{10}$) or pentasilane ($Si_5H_{12}$), and the tetrasilane and/or pentasilane may be linear (i.e., $H_3Si$—$SiH_2$—$SiH_2$—$SiH_3$), branched (i.e., $HSi[SiH_3]_3$), or a mixture of linear and branched silanes. In one embodiment, a mixture of linear and branched tetrasilanes may have a linear: branched ratio of from 1:100 to 100:1 or any range of values therein. The pentasilane may be neopentasilane ($[SiH_3]_4Si$), which may be available from Voltaix, Branchburg, N.J. (and which may contain small amounts of trisilane and tetrasilane as impurities).

In certain embodiments, the silane monomer(s) further comprise a cyclosilane having the formula c-$A_bH_{2b}$, in particular where A is Si and b is 4 to 8, especially where b is 5 (i.e., cyclopentasilane [c-$Si_5H_{10}$]). It is believed that a small amount of cyclosilane monomer (e.g., 0.1-10 mol % relative to the amount of linear and/or branched silane monomer) may help initiate silane polymerization by a ring-opening mechanism (e.g., the NHC, alone or after dissociation from a transition metal, may cleave a Si—Si bond), and the ring-opened cyclosilane may react relatively easily with a linear and/or branched silane monomer to form a Si—Si bond and/or abstract hydrogen.

In other embodiments, linear, cyclic, branched and/or crosslinked silanes of the general formulae $Si_{a'}H_{2a'+2}$, $Si_{a'}H_{2a'}$, or $Si_{a'}H_{2a'-p}$, where a' is an integer of up to 10, 15, 20, or more, and p is an even integer not greater than a', may be further crosslinked, oligomerized and/or polymerized by the present method. In such embodiments, the linear, cyclic, branched and/or crosslinked silanes may be prepared by the present method or by a method described in U.S. patent application Ser. No. 11/246,014 or 11/867,587, the relevant portions of which are incorporated herein by reference.

In alternative embodiments, a compound of the formula $A_aH_{2a+2-b}R_b$ and/or the formula c-$A_mH_{pm}R^1_{rm}$ may be polymerized by a catalyst selected from N-heterocyclic carbenes, N-heterocyclic carbene-metal complexes, lanthanide metal salts, compounds and complexes, and supported derivatives of such catalysts to form a poly(aryl)silane or poly(halo)silane, where each instance of A is independently Si or Ge, a is at least 1 (e.g., from 1 to 10), b is from 0 to 2a (preferably 0 to a), and each instance of R and $R^1$ is independently aryl, substituted aryl, halogen, or pseudohalide; m is an integer from 3 to 12 (preferably 4 to 8), p is 1 or 2, and p+r is 2. Preferred arylsilane starting compounds include those of the formula $A_aH_{a+2-b'}R_{b'}$, in which b' is from 1 to a, and R is phenyl, tolyl, mesityl, or naphthyl (particularly phenyl or tolyl).

In further embodiments, the NHC and/or NHC-metal complex may used to catalyze polymerization reactions between linear, branched, and/or cyclic polysilanes (e.g., polysilanes comprising blocks repeating units of $A_aH_{2a}$, $A_nH_jR_k$, and/or cyclo-$A_mH_{2m-2}$) comprising more than 12 A atoms (e.g., 13-500 A atoms, 50-150 A atoms, or any value or range of values therein) to form even larger polysilanes.

Oligosilane(s) or polysilane(s) that are substantially free from carbon contaminants are suitable for forming semiconductor layers in electronic devices. When an aryl silane monomer is used to form an oligosilane and/or polysilane according to the present method(s), the aryl groups are preferably removed after the polymerization reaction. Thus, in embodiments where an arylsilane is used as a monomer, the oligoarylsilane and/or polyarylsilane products are reacted with (i) a halogen source and (optionally) a Lewis acid or (ii) trifluoromethanesulfonic acid (HOTf) to form a polyhalosilane. The procedure for Lewis acid-catalyzed halogenation (e.g., treatment or reaction of the polyarylsilane with HCl and $AlCl_3$ in an inert organic solvent such as cyclohexane) is largely as described in U.S. Pat. Nos. 7,485,691 and 7,498,015, the relevant portions of which are incorporated herein by reference. However, exemplary variations of the procedure include a halogenation (e.g., chlorination) by bubbling HX gas (e.g., dry HCl) through a solution of oligoarylsilane and/or polyarylsilane and Lewis acid for a length of time of from 30 min. to about 6 hours to form an oligochlorosilane and/or polychlorosilane, and reduction using a metal hydride reducing reagent (including, but not limited to lithium aluminum hydride [LAH] and diisobutylaluminum hydride [DIBAL]) for a length of time of from about 1 hour to about 16 hours (e.g., overnight). Other exemplary metal hydride reducing agents are disclosed in U.S. Pat. Nos. 7,314,513, 7,485,691, 7,498,015 and 7,674,926, the relevant portions of which are incorporated herein by reference. Also, the reagent addition sequence preferably comprises adding a solution of metal hydride (e.g., LAH) in an inert organic solvent (e.g., dry diethyl ether) to a stirred solution of oligochlorosilane and/or polychlorosilane. Workup is generally as described in U.S. Pat. Nos. 7,314,513, 7,485,691, 7,498,015 and 7,674,926, the relevant portions of which are incorporated herein by reference.

In further embodiments, the polymerization mixture may further include one or more dopant species, preferably including compounds containing (or consisting essentially of) silicon and/or germanium, hydrogen, and a dopant atom such as B, Ga, P, As, Sb, etc. For example, a dopant species particularly suitable for use in the present methods of making polysilanes, polygermanes and/or polysilagermanes includes compounds of the formula $D(A_xH_{2x+1})_3$ (e.g., $D(AH_3)_3$), where D is selected from the group consisting of B, Ga, P, As and Sb, A is Si or Ge, and each x is independently an integer of from 1 to 4. Another species includes compounds of the formula $AH_y(DH_2)_z$ (e.g., $A(DH_2)_4$), where A and D are as described herein and (y+z)=4.

In one embodiment of the method, the silane compound and the NHC or NHC-metal complex are combined and reacted for a length of time sufficient to form the oligosilane or polysilane (e.g., as described herein). Generally, the present polymerization reaction is conducted at ambient temperatures (e.g., without applied heating or cooling; from about 15 to less than 30° C., or any range of values therein). However, it is anticipated that the silane compound and the catalyst may be combined and reacted at a temperature of at least from at least about −196° C. (e.g., the temperature of liquid nitrogen), about −78° C. (e.g., the temperature of a dry ice bath), or 0° C. (e.g., the temperature of ice) to ambient temperature or higher (e.g., up to the boiling point of the silane monomer [if the polymerization is conducted neat] or a solvent, which in the case of decalin, is about 187-196° C.), or any range of temperatures therein. Alternatively, the reaction may be conducted at a temperature of up to 300-500° C. (e.g., for gas-phase silane monomers such as silane [$SiH_4$], or disilane [$Si_2H_6$], in which case the reaction may be conducted at a pressure >1 atm). As described elsewhere herein, elevated pressures and/or temperatures may also be beneficial for polymerization of silanes (e.g., perhydrosilanes) having a molecular weight higher than that of disilane, in both gas and liquid/condensed phases.

In general, when the reaction is conducted in a solvent, solvent mixture, or in the absence of added solvent, the reaction time may be at least 1 sec, 1 min, 10 min, or 1 h. For example, the reaction may be conducted for a length of time of from 5 min. to 96 h., 10 min. to 24 h., 30 min. to 8 h., or any range of values therein. For many combinations of the NHC or NHC-metal complex catalyst and silanes (e.g., trisilane [$Si_3H_8$], tetrasilane [$Si_4H_{10}$], cyclopentasilane [$Si_5H_{10}$], other perhydrosilanes and hydrosilanes), a reaction time of 30 minutes to 2 hours at a temperature of 15-30° C. is sufficient to consume most of the monomer (e.g., at least 60%, 70% or 80%), increase the average molecular weight (e.g., the weight-average or number average molecular weight, but preferably expressed as an average number of silicon atoms) of the oligo- or polysilane by at least 100%, 200%, or more, and/or increase the viscosity of an ink consisting essentially of 1-40 wt. % of the polysilane product in an organic solvent (e.g., a $C_5$-$C_{10}$ cycloalkane solvent). Suitable solvents and solvent mixtures for the present polymerization reaction generally include nonpolar organic solvents such as $C_5$-$C_{10}$ alkanes and $C_6$-$C_{10}$ cycloalkanes, such as hexanes, cyclohexane, cyclooctane, and decalin, $C_6$-$C_{10}$ arenes such as benzene, toluene and tetralin, $C_4$-$C_8$ dialkyl ethers such as diethyl ether and methyl t-butyl ether, etc., and mixtures thereof. Alternatively, when the reaction is run in the gas phase (e.g., where the silane monomer comprises a silane having 1-2 Si and/or Ge atoms), or the reaction is conducted under conditions (e.g., under a vacuum, at an elevated temperature, etc.) to sufficiently volatilize higher molecular weight silanes, contact time between the gas-phase silane monomer and the catalyst may be quite short, although the total time for passing the gas-phase reactants over the catalyst may be relatively long.

In one embodiment, removing the catalyst from the oligosilane or polysilane comprises filtering the polymerization reaction mixture to remove the catalyst. In one embodiment, filtering comprises passing the reaction mixture through a pad or bed of adsorbent. Suitable adsorbents include a chromatography gel or finely divided oxide of silicon and/or aluminum (including silicates, aluminates and/or aluminosilicates) that is substantially unreactive with the oligosilane or polysilane. A preferred adsorbent is Celite. In other embodiments, filtering comprises passing the reaction mixture through a PTFE membrane filter with pore size less than 0.45 μm (e.g., 0.2 μm, or other value therein or therebelow) or through a metal-removing and/or purification filter and/or resin. In further embodiments, the oligosilane and/or polysilanes may be removed from the reaction mixture by mechanical methods, such as decanting, centrifuging, etc. For instance, the oligosilane and/or polysilanes may be separated from the catalyst by centrifugation, and subsequently decanted into a separate vessel. The catalyst may then be washed, dried, re-activated and recycled for use in a subsequent polymerization reaction.

Once polymerized, the polymer (or polymer mixture) may be characterized (e.g., to determine the molecular weight distribution, the identity and/or quantity of one or more impurity atoms, etc.). Characterization techniques for establishing microstructural features of the polymers may include mass-spectrometric methods (e.g., FAB-MS or ESI-MS), gas and/or gel permeation chromatography, nuclear magnetic spectroscopy (e.g., $^1H$ and/or $^{29}Si$), SIMS analysis (e.g., of deposited polysilane films after being converted to amorphous silicon upon curing), etc.

Dehydrogenative Coupling of Silanes Using Lanthanide Metal Catalysts

Lanthanide compounds are believed to be very active dehydrocoupling catalysts for polysilane, polygermane and/or polysilagermane synthesis. Unfortunately, known catalysts (containing hydride and/or alkyl ligands) can be challenging and/or time-consuming to synthesize. Instead of using lanthanide hydride and alkyl lanthanide catalysts, the present invention may include the use of a low-valent lanthanide compound (e.g., a lanthanide salt or compound having a relatively low oxidation state [e.g., +2] and/or a relatively small number of ligands [e.g., no more than 2 or 3 per lanthanide metal atom]) to act as a catalyst for homogeneous synthesis of polysilanes. It is believed that low-valent lanthanide complexes use oxidation-reduction chemistry to form lanthanide metal-Si bonds that create the active site for silane polymerization. The driving forces in these reactions are believed to be the Ln(II) to Ln(III) redox coupling for the lanthanide metal (e.g., Yb, Sm, Tm, Nd, Eu, or Dy), although any lanthanide compound or complex having a relatively stable redox couple (e.g., Ce, Pr) and a relatively small number of ligands may be suitable in the present method. Linear, branched and/or cyclic silane and/or germanium compounds can act as monomers for polysilane synthesis using lanthanide metal compounds and lanthanide metal-ligand complexes as catalysts.

For example, lanthanide salts and/or compounds (e.g., $TmI_2$) and lanthanide complexes (e.g., $Cp_2Sm$ or $Cp*_2Sm$) may catalyze the polymerization and/or oligomerization of low molecular weight silanes (e.g., trisilane or tetrasilane) and cyclosilanes (e.g., cyclopentasilane) in a similar manner to NHC and NHC-metal catalysts. In general, silane monomers that may be polymerized and/or oligomerized by this method include those described elsewhere herein. This method involves formation of silicon-silicon bonds between (cyclo)silane monomers, which may release hydrogen gas and/or volatile silanes. The polymerization reaction generally forms a polysilane similar or identical to those formed by NHC- or NHC-metal complex-catalyzed polymerization. Generally, oligosilanes and/or polysilanes made by the present method are generally soluble in nonpolar solvents (e.g., $C_5$-$C_{10}$ alkanes and $C_6$-$C_{10}$ cycloalkanes, such as hexanes, cyclohexane, cyclooctane, and decalin, $C_6$-$C_{10}$ arenes such as benzene, toluene and tetralin, $C_4$-$C_8$ dialkyl ethers such as diethyl ether and methyl t-butyl ether, etc., and mixtures thereof).

The lanthanide-based catalysts may be divalent compounds that may or may not include ligands or activators. For example, some lanthanide salts/compounds of Tm, Dy, and Nd may not include a ligand or activator, such as, for instance, $TmI_2$, $DyI_2$, and $NdI_2$. Lanthanide complexes may include divalent compounds that include a lanthanide metal (e.g., Yb, Sm, Tm, Nd, Eu, Dy, etc.) and one or more ligands such as cyclopentadiene, a substituted cyclopentadiene (e.g., pentamethyl-cyclopentadiene [Cp*]), pentadienyl (which may be substituted with from 1 to 5 alkyl groups or 1 to 5 silyl or trialkylsilyl groups), allyl (which may be substituted with from 1 to 5 alkyl groups or 1 to 3 silyl or trialkylsilyl groups), or a pyrimidinone (e.g., 1,3-dimethyl-3,4,5,6-tetrahydro-2 (1H)-pyrimidinone [DMPU]).

Additionally, lanthanide metal catalysts may be immobilized on a carrier (e.g., on a silicate, alumina, carbon, polymer beads or gel, etc.) to facilitate polymerization without introducing catalyst impurities into the silane ink. Because the lanthanide metal catalyst is anchored to a carrier via one or more suitable ligands, it generally does not leach into or otherwise contaminate the reaction mixture. The use of lanthanide metal catalysts supported on a substrate in heterogeneous catalysis of silanes has significant economical advantages, as well. These supported catalysts may be used to polymerize small silane monomers such as monosilane, disilane or trisilane in gas phase over the supported catalyst, optionally under high pressure (e.g., at least 5 or 10 atm, up to 15, 20 or 30 atm) or autoclave conditions. Liquid phase polysilanes may be recovered as a product from such reactions. Higher molecular weight silane monomers may also be polymerized by passing them over the supported catalyst in the gas phase or by contacting them with the supported catalyst in the liquid phase at elevated temperatures and/or reduced pressures. Additionally, solid-supported lanthanide metal catalysts provide a general platform for silane polymerization catalysts with minimal metal contamination in the final polysilane product.

In some embodiments where a silane having 1-5 silicon or germanium atoms is used as a monomer, one of the more reactive divalent lanthanide compounds such as $Cp*_2Sm$, $TmI_2$, $DyI_2$, and $NdI_2$ may be used as a catalyst because they can more efficiently catalyze the polymerization of small silanes (e.g., trisilane, tetrasilane, etc., which in the case of tetrasilane or larger perhydrosilane monomers, may be linear, cyclic, and/or branched). In other embodiments where a silane having 1-5 silicon or germanium atoms is used as a monomer, a small amount of cyclopentasilane may be included in the reaction mixture with a linear or branched silane and the lanthanide catalyst.

In an alternative embodiment, silane compounds of the formulae $A_aH_{2a+2-b}R_b$ and/or $c-A_mH_{pm}R^1_{rm}$ may be polymerized by a lanthanide metal compound (or a supported derivative thereof) to form a poly(aryl)silane or poly(halo)silane, then the aryl groups (if any) are removed, and the halogen/pseudohalide groups reduced, as described elsewhere herein. In further embodiments, the starting materials may optionally include one or more dopant species (e.g., compounds of the formula $D(A_xH_{2x+1})_3$ or $AH_y(DH_2)_z$, where A and D are as described herein, x is an integer of from 1 to 4, and (y+z)=4), as described herein. The reaction may include conditions that are generally the same as those described above for NHC- and/or NHC-metal complex-catalyzed polymerization described above, and result in the formation of doped oligosilanes and/or polysilanes.

In all of the present homogeneous and/or heterogeneous polymerization methods, hydrogen and/or volatile silane gas (ses) generated during the reaction may be continuously removed with an inert gas stream (e.g., nitrogen, argon, etc.) or via a dynamic vacuum, or by increasing the liquid-gas phase interface area to promote an increased hydrogen removal rate, or other known methods. Also, in some cases, fresh catalyst may be advantageously added after completion of an initial reaction period (e.g., from about 1 sec., 1 min., or 1 h. to about 50% of the total reaction time) to continue increasing the molecular weight (e.g., weight-average or number-average molecular weight) of the oligo- or polysilane, increase the viscosity of a solution of the oligo- or polysilane, or to consume more monomer.

The homogenous lanthanide catalysts may be easily removed from the resulting reaction product by water washing (see U.S. Pat. No. 7,498,015, the relevant portions of which are incorporated herein by reference). Exposure of the polysilane to alkaline conditions should be avoided as it may lead to uncontrolled Si—Si bond scission and polymerization. Minimal chemical effects on the silane composition may be achieved when aqueous washing (preferably using neutral or DI water) is carried out. The ratio of water to polysilane (or reaction mixture) is in the range of 10:1 to 1:10, more preferably between 5:1 and 1:5, and even more preferably about 2:1. After separation from the aqueous phase, the polysilane solution is dried using standard drying methods, such as contacting with molecular sieves. Preferably, the molecular sieves comprise beads of the 4 Å type (e.g., commercially available from Aldrich Chemical Co.). The polysilane is generally temperature and light sensitive, so after filtering, it is stored at a low temperature, preferably at or below 0° C., and with light and UV protection (e.g., storing in a darkened vial or wrapping with aluminum foil) to further avoid any unwanted isomerization or generation of higher molecular weight components.

Alternatively, the catalyst may be removed from the reaction mixture by filtering through an adsorbent such as Florisil®, or when the catalyst is heterogeneous, or after a homogenous catalyst has been precipitated by a mechanical method, such as decanting, centrifuging, filtering etc., and the solvent (if present) may be evaporated to give a clear oil or gel-like material. The reaction conductions, such as the selection of catalyst type and ligand, reaction time, and temperature may be varied, but are generally as described above for NHC- and NHC-metal complex-catalyzed polymerization. Variations of other reaction conditions, such as pressure, catalyst loading, and solvent can control the production of long-chain oligomers and polymers of (cyclo)silanes.

In addition to or instead of filtration through an adsorbent such as Florisil® or Celite®, the metal-based salt, compound or complex catalyst may be removed with a metal-scavenging column containing immobilized ligand functionalities such as thiol and/or thiourea groups or other functionalities with high affinity for binding to the metal(s) in the catalyst. In an alternative embodiment, the catalyst may be supported on a stationary gel or polymer phase such as silica, alumina or polystyrene beads, so as to facilitate isolation of the polysilane products and/or recovery of the catalyst. Thus, the catalyst may be immobilized on and/or anchored to a support or other substrate, and removing such a catalyst from the product (e.g., polysilane) may comprise filtering or centrifuging the immobilized and/or anchored catalyst and/or decanting the polysilane. Alternatively, removing the catalyst from the polysilane may comprise solid phase extraction of the catalyst using a column having thiol or thiourea groups thereon. In one further alternative embodiment, removing the catalyst from a polysilane comprises extracting the catalyst from an organic phase comprising the polysilane with a water-soluble thiol in an aqueous phase. Once the catalyst is separated from the oligo- and/or polysilane product, the catalyst may then be washed, dried, re-activated and recycled for use in a subsequent polymerization reaction.

Moreover, it is possible to remove and/or recover the unreacted monomer (such as trisilane, tetrasilane, cyclopentasilane or other monomer) from the reaction mixture, and use (or recycle) it in subsequent reactions. In various embodiments, including lanthanide metal-catalyzed polymerization, NHC- and NHC-metal complex-catalyzed polymerizations, removing and/or recovering the unreacted monomer comprises evaporating the unreacted monomer and trapping the evaporated unreacted monomer at a relatively low temperature (e.g., in a cold trap at −196° C., on a cold finger at −78° C., etc.). Other reaction conditions, such as solvent, dopant species, and characterization method or technique may be used, varied and/or optimized as described above for the NHC- and NHC-metal complex-based catalysts.

An Exemplary Method of Removing Low Molecular Weight (MW) Silanes from Oligosilane/Polysilane Mixtures A typical reaction workup for a crude reaction mixture of polysilane includes dilution with cyclohexane, followed by filtration and gentle solvent removal (e.g., with relatively low vacuum, such as house vacuum; for example, greater than 10, 20, or 30 Torr, or any value therein), preferably in a drybox (glove box). However, such relatively low vacuum does not necessarily remove all of the residual monomer or any relatively undesired oligomer (e.g., silane having a Si and/or Ge chain length of 10 or fewer atoms), although retaining a small amount of the monomer or such oligomer may advantageously facilitate dissolving the longer-chain components of the polysilane.

Excess silane monomer or low-MW oligomer may be removed by applying a high vacuum (e.g., ≤1 Torr, 500 mTorr, 200 mTorr, 50 mTorr or any value therein, down to a value that also significantly decreases the amount of oligomers having 10 or fewer Si atoms, such as 1, 2, or 5 mTorr) for about 2 hours or more. In this manner, the amount of silane monomer left in the reaction mixture may be reduced to less than 10%, 8%, or 5% (e.g., by weight). However, in some embodiments, it may be beneficial to keep in the oligosilane/polysilane mixture at least 1 wt. %, 2 wt. % or more of oligomers having 10 or fewer Si atoms (e.g., to increase the solubility of higher MW polyhydrosilanes in a subsequently formed ink). Depending on the specific printing surface and its surface energy, a composition containing more than 5 or 10% by weight of volatile silanes (e.g., having a boiling point of less than 150° C. or 200° C.) may be preferable.

Exemplary Polysilanes, Polygermanes and/or Polysilagermanes

Another aspect of the invention includes polysilanes, polygermanes and/or polysilagermanes having an atomic purity of greater than 90% with respect to silicon, germanium and hydrogen (i.e., greater than 90% of the atoms in the polysilane are either Si or H). In particular, the present oligosilanes and/or polysilanes may have an atomic purity of at least 95%, at least 99%, or any value therein, with respect to silicon, germanium and hydrogen. In one embodiment in which the polysilanes, polygermanes and/or polysilagermanes are made from silane monomers of the formula $Si_nH_{2n+2}$ and/or cyclo-$Si_mH_{2m}$, the polysilanes, polygermanes and/or polysilagermanes may have an atomic purity of greater than 99% with respect to silicon and hydrogen (i.e., greater than 99% of the atoms in the polysilane are either Si or H). Preferably, such oligosilanes and/or polysilanes have an atomic purity of at least 99.5%, at least 99.9%, or any value >99%, with respect to silicon and hydrogen.

A preferred polysilane polygermane and/or polysilagermane composition consists essentially of (i) hydrogen and (ii) silicon and/or germanium, and has 15 to 10,000, 100,000 or 1,000,000 silicon and/or germanium atoms, or an average chain length ranging from 15 to 1,000, 10,000 or 100,000 silicon and/or germanium atoms. The present polysilane, polygermane and/or polysilagermane composition is noteworthy for its capability to form coated or printed thin conductor, semiconductor or dielectric films with very high purity levels, accurate thickness control, good surface smoothness, consistent density, and/or high pattern fidelity. Thus, in some embodiments of the present composition, after coating and/or printing the composition (optionally with simultaneous or immediately subsequent actinic irradiation) to form an oligo- or polysilane film, then curing to form an amorphous, hydrogenated semiconductor film, the amorphous, hydrogenated semiconductor film may have a carbon content of not greater than 0.1 at %. In further embodiments, the carbon content of the thin semiconductor film(s) is not greater than 0.05 at %, 0.02 at %, or 0.01 at %. In further embodiments, the film made from the polysilane, polygermane and/or polysilagermane composition has a transition metal content of not greater than 1 part per million, preferably not greater than 0.1 parts per million, more preferably not greater than 0.02 parts per million. In still further embodiments, the film made from the polysilane, polygermane and/or polysilagermane composition has an oxygen content <0.05 at % and/or a nitrogen content of not greater than 100 parts per million.

In alternative embodiments, the polysilane, polygermane and/or polysilagermane may have 15 to 10,000, 100,000 or 1,000,000 silicon and/or germanium atoms, generally covalently bound to at least 1 or 2 other silicon and/or germanium atoms. In further embodiments, the molecular weight (which may be a molecular weight distribution or a weight or number average molecular weight) is at least about 1000 g/mol, preferably at least about 1500 g/mol. In further embodiments, the polysilane, polygermane and/or polysilagermane may have a chain length (which may be a chain length distribution or an average chain length) of from about 15 to about 10,000 silicon and/or germanium units, preferably from about 15 to about 1000 silicon and/or germanium units. For example, the composition may include or consist essentially of a mixture of soluble oligosilanes and/or polysilanes, each oligosilane or polysilane therein consisting essentially of (i) hydrogen and (ii) silicon and/or germanium, soluble in a certain solvent (e.g., a $C_6$-$C_{10}$ cycloalkane, such as cyclohexane, cyclooctane, or cis- and/or trans-decalin) and having the prescribed molecular weight and/or chain length.

Exemplary Inks Including Polysilanes, Polygermanes and/or Polysilagermanes

In general, one composition contains one or more polysilanes, polygermanes and/or polysilagermanes (as described herein) and a solvent in which the polysilane(s), polygermane(s) and/or polysilagermane(s) are soluble. The solvent may include any of a wide variety of solvents, such as those described in U.S. Pat. Nos. 7,314,513, 7,485,691, 7,674,926, and 7,879,696, the relevant portions of which are incorporated herein by reference. However, for reasons relating to ease and/or completeness of removal, properties facilitating coating and printing, and compositional stability, preferred solvents include linear alkanes, cycloalkanes, polycycloalkanes, and mixtures thereof. For example, the solvent may be a linear or branched $C_6$-$C_{12}$ alkane (e.g., hexane, heptane, octane, decane), a $C_6$-$C_{10}$ cycloalkane (e.g., cyclohexane, cyclooctane), a $C_8$-$C_{14}$ polycycloalkane (e.g., decalin), or a mixture thereof.

The composition may contain the polysilane(s), polygermane(s) and/or polysilagermane(s) in an amount of from about 0.5 to about 50% by weight or by volume (e.g., from about 1 to about 30% or about 5 to about 25% by weight or by volume, or any range of values between 0.5 and 50%). Furthermore, to improve the purity of a semiconductor thin film produced from the composition, the ink composition preferably consists essentially of the polysilane(s), polygermane(s) and/or polysilagermane(s), a solvent, and optionally, a dopant. In another preferred embodiment, the polysilane, polygermane and/or polysilagermane component of the present ink composition contains <10% by weight of monomer and/or silanes, germanes and/or silagermanes having ≤10, 8, 7 or 5 silicon and/or germanium atoms, optionally, depending on the identity of the monomer. The solvents and mass loadings described herein for polysilane, polygermane and/or polysilagermane inks may also be appropriate for inks containing compounds of the formula $(NHC)_2(A_2)$ and $(NHC)_2(H_xD_2)$, where x is 0 unless D is B, in which case x is 1. The compounds of the formula $(NHC)_2(H_xD_2)$ may be useful dopant sources for the polysilanes, polygermanes and/or polysilagermanes described herein.

An Exemplary Method of Making Silicon- and/or Germanium-Containing Thin Films

A general method of forming a semiconductor (or other silicon- and/or germanium-containing) film from a low-carbon, low metal contaminant composition of the invention includes coating or printing the ink composition described above onto a substrate; and heating the coated or printed composition (i) in an inert or reducing atmosphere sufficiently to form an amorphous, hydrogenated semiconductor film, or (ii) in an oxidizing atmosphere sufficiently to form a silicon- and/or germanium-containing oxide film. The method of forming an amorphous, hydrogenated semiconductor film optionally includes annealing and/or irradiating the amorphous, hydrogenated semiconductor film sufficiently to at least partially crystallize and/or reduce a hydrogen content of the amorphous, hydrogenated semiconductor film and form the semiconductor film. Either method may further include irradiating the composition with actinic radiation, simultaneously with or immediately subsequent to coating or printing the composition onto a substrate, substantially as disclosed in U.S. Pat. Nos. 7,314,513, 7,485,691, 7,674,926, 7,687,327, 7,767,520 and 7,879,696, the relevant portions of which are incorporated herein by reference.

The composition may further include one or more dopants. In sufficiently high doses, the presence of the dopant can result in formation of a conductor film. The dopants are generally compounds containing one or more dopant atoms, for example selected from the group consisting of B, Al, Ga, P, As and Sb. For example, the dopant compounds may be selected from those disclosed above. However, in preferred embodiments, the dopant compounds consist essentially of the dopant atom(s), silicon and/or germanium atoms, and hydrogen, isopropyl ($—CH[CH_3]_2$) and/or t-butyl ($—C[CH_3]_3$) groups. In most preferred embodiments, the dopant compounds consist essentially of the dopant atom(s), silicon and/or germanium atoms, and hydrogen. Therefore, preferred dopants may have the formula cyclo-$(AH_z)_n(DR^1)_m$ (where n is from 2 to 12, m is 1 or 2, each of the n instances of z is independently 1 or 2, and each of the m instances of $R^1$ is alkyl [e.g., t-butyl], aryl, aralkyl, or $AR^2_3$, where $R^2$ is hydrogen or $A_yH_{2y+1}$ [e.g., 1≤y≤4], such as $SiH_3$ and $Si(SiH_3)_3$), $(A_nH_z)_m(DR^1_{3-m})_q$ (where n is from 3 to 12, z' is from (n−q) to (2n+2−q), m is from 1 to 3, q is from 1 to n [preferably 1 or 2], and each of the (3−m) instances of $R^1$ is independently H, alkyl [e.g., t-butyl], or $AR^2_3$), $(AH_p)_n(DR^1_2)_2$ (where n is from 3 to 12, each of the n instances of p is independently 1 or 2, and each $R^1$ is independently H, alkyl [e.g., t-butyl], or $AR^2_3$), $D_aR^1_b$ (where a is from 1 to 20, each of the b instances of $R^1$ is independently H, alkyl [e.g., t-butyl], or $AR^2_3$, at least one of the b instances of $R^1$ is alkyl or $AR^2_3$, and b is an integer corresponding to the number of binding sites available on the a instances of D), $(R^2_3A)_rA_c(DR^1_2)_s$ (where c is 1 to 4, r+s=2c+2, s≥1 [preferably s≥3], and $R^1$ and $R^2$ are as described for $D_aR^1_b$), or (as described above) $D(A_xH_{2x+1})_3$ or $AH_y(DH_2)_z$, where D is selected from the group consisting of B, Al, Ga, P, As and Sb (preferably B, P, As and Sb), and A is Si or Ge. Suitable dopant-containing compounds are disclosed in U.S. Pat. Nos. 7,314,513 and 7,674,926, U.S. Pat. Appl. Publ. No. 2008-0085373, and U.S. patent application Ser. No. 11/249,167, the relevant portions of which are incorporated herein by reference. The dopant(s) may be present in an amount providing a concentration of dopant atoms (e.g., boron, phosphorous, arsenic, etc.) from $10^{13}$ to $10^{21}$ atoms/cm$^3$ (e.g., $10^{15}$ to $10^{17}$, $10^{16}$ to $10^{18}$, $10^{17}$ to $10^{19}$, $10^{19}$ to $10^{21}$ atoms/cm$^3$, or any range of values therein).

In further embodiments, dielectric films may be formed from the presently disclosed ink compositions. The dielectric film may be formed by coating or printing an ink composition comprising one or more polysilanes, polygermanes and/or polysilagermanes, and subsequently oxidizing the polysilanes, polygermanes and/or polysilagermanes. The coated or printed ink composition may be oxidized by heating (e.g., at a temperature ≥ambient temperature and ≤400° C., in a furnace or rapid thermal annealing [RTA] apparatus) or irradiating the structure) in an oxidizing atmosphere, such as one comprising oxygen ($O_2$), ozone ($O_3$), a nitrogen oxide such as $N_2O$, $H_2O_2$ vapor, etc. The oxidizing atmosphere may also contain an inert component such as $N_2$, Ar, He, etc., and may be dried before use by passing through or over a desiccant (such as anhydrous $CaCl_2$, $CaSO_4$, etc.). The pressure during the oxidation may be from about 1 atm to 3, 4, 5 or more atm. In a further embodiment, the coated or printed ink composition may be cured in inert atmosphere (e.g., $N_2$, Ar, He, etc., at a pressure of about atmospheric pressure of about 1 atm) at a temperature of ≤200° C., ≤150° C., ≤120° C. or any maximum temperature of less than 200° C. prior to being oxidized in an oxidizing atmosphere.

Alternatively, an oxidized polysilane, polygermane and/or polysilagermane ink may be obtained by introducing oxygen in a controlled manner to a solution of a polysilane, polygermane and/or polysilagermane. To make an oxidized (poly)silane ink, an oxygen source (e.g., dry air) is bubbled through a solution of the polysilanes, polygermanes and/or polysilagermanes in a solvent. The polysilanes, polygermanes and/or polysilagermanes may be present in the solution in any amount, for example from 1-99 wt. % (e.g., 1-40 wt %). The solvent may comprise a hydrocarbon solvent (e.g., a $C_5$-$C_{12}$ alkane or cycloalkane, a $C_6$-$C_{12}$ arene or alkylated arene, etc.), a $C_1$-$C_{12}$ alcohol (e.g., methanol, ethanol, propanol, isopropanol, butanol, pentanol, hexanol, cyclohexanol, octanol, decanol, dodecanol), a $C_4$-$C_{12}$ ether alcohol containing from 2 to 4 oxygen atoms (e.g., butyl carbitol, tetrahydrofurfuryl alcohol, dipropylene glycol butyl ether, etc.), a polyether, a methicone solvent, an amide of a $C_1$-$C_4$ alkanoic acid containing up to two $C_1$-$C_4$ alkyl groups on the nitrogen atom (e.g., formamide, dimethyl formamide), a $C_2$-$C_4$ sulfoxide (e.g., dimethyl sulfoxide), a cyclic ester of a $C_2$-$C_{10}$ hydroxylated alkanoic acid (e.g., butyrolactone), a $C_1$-$C_4$ alkyl ester of a $C_1$-$C_4$ alkanoic acid (e.g., ethyl acetate), a $C_4$-$C_8$ ether (e.g., diethyl ether, dibutyl ether, methyl t-butyl ether, tetrahydrofuran), a $C_3$-$C_6$ ketone (e.g., acetone, methyl ethyl ketone, methyl t-butyl ketone, cyclopentanone, cyclohexanone), a siloxane (e.g., cyclo-([Me$_2$Si]O)$_3$, cyclo-([Me$_2$Si]O)$_4$, etc.), or a mixture thereof. The oxygen source may comprise any source of oxygen that does not contain undesired contaminants (e.g., O$_2$, O$_3$, H$_2$O$_2$, etc.). When in the gas phase, the oxygen source may be introduced into the reaction mixture by gas bubbler, syringe, vigorous stirring under an atmosphere containing the oxygen source, etc. The gas phase oxygen source may also contain an inert component such as N$_2$, Ar, He, etc., and may be dried by passing through or over a desiccant (such as anhydrous CaCl$_2$, CaSO$_4$, etc.) before introduction into the reaction mixture. The reaction may be conducted at any temperature at which the reaction occurs (e.g., a temperature of from −78° C. to 400° C., or any value or range of values therein), but the reaction generally proceeds smoothly at room temperature or ambient temperature (e.g., from about 15° C. to about 30° C.). The reaction, which may be monitored by spectroscopy (e.g., infrared spectroscopy), may be stopped after Si—Si bonds are broken to form —Si—O—Si— bonds. Since the precursor molecules can be perhydrooligo- and/or -polysilanes (i.e., containing no Si—O—C or Si—C bonds), this oxidation process provides the benefit of a dielectric precursor that is substantially carbon free.

Doped dielectric films may be formed by introducing one or more dopant(s) (e.g., boron, phosphorous, etc., which may be a perhydrogenated species such as B$_2$H$_6$ or PH$_3$) and/or dopant precursor(s) as described above (e.g., compounds of the formula D$_a$R$^1_b$) to an polysilane, polygermane and/or polysilagermane as described herein, either before or after the oxidation step. For example, in one embodiment, doped oxidized silanes may be formed by adding a dopant and/or dopant precursor to a polysilanes, polygermanes and/or polysilagermanes as described herein, before the oxidation step. Doping of such polysilanes, polygermanes and/or polysilagermanes prior to an oxidation step may incorporate dopant atoms (e.g., via oxidative incorporation of the dopant and/or dopant precursor in the polysilanes, polygermanes and/or polysilagermanes) into the resulting oxidized doped polysilanes, polygermanes and/or polysilagermanes.

Semiconductor and/or Silicon- and/or Germanium-Containing Thin Films

A semiconductor or silicon-containing film may be formed from compositions described herein by coating or printing the composition onto a substrate; heating the coated or printed composition sufficiently to form an amorphous, hydrogenated semiconductor; and optionally annealing and/or irradiating the amorphous, hydrogenated semiconductor sufficiently to at least partially crystallize and/or reduce a hydrogen content of the amorphous, hydrogenated semiconductor and form the semiconductor film. This method may include irradiating the composition with actinic radiation, simultaneously with or immediately subsequent to coating or printing the composition onto the substrate. The composition may further comprise one or more dopants, as described herein.

A preferred thin film in accordance with the invention consists essentially of one or more Group IVA elements selected from silicon and germanium. Thus, one thin film consists essentially of silicon (e.g., in crystalline, polycrystalline and/or microcrystalline form), and another thin film consists essentially of hydrogen and silicon (e.g., in amorphous form). In preferred embodiments, the carbon content of the thin film is not greater than 0.1 at % and preferably not greater than 0.05 at %, as determined by SIMS analysis. Preferred films made from the present polysilane compositions have a transition metal content of not greater than 1 part per million (ppm), particularly not greater than 0.1 ppm or 0.02 ppm, or any value below 1 ppm. Also, the film may have an oxygen content of not greater than 0.1 at %. In particular, the oxygen content may be <0.05 at %. The film may have a nitrogen content of not greater than 100 parts per million. As discussed above, the present films may be highly or very highly doped to form a conductor film, either prior to or after polysilane, polygermane and/or polysilagermane deposition, and/or oxidized to form a dielectric film.

The above methods may be employed to make a conductive, semiconducting and/or dielectric silicon- and/or germanium-containing layer in a thin film transistor, capacitor, diode and/or resistor device and/or a circuit comprising such a device, and be used, e.g., in an EAS (electronic article surveillance) or RFID (radio frequency identification) tag, display, sensor, MEMS, light sensing, light-emitting, and/or photovoltaic (e.g., solar device) application. Thus, the invention includes a thin film transistor, capacitor, diode and/or resistor device and/or circuit, comprising the conductor, semiconductor and/or dielectric film as described herein and/or made using the materials and/or methods described herein. The invention also further relates to and includes a method of making an EAS or RFID tag, display backplane or driver, sensor, MEMS and/or photovoltaic device or circuit, comprising forming a conductor, semiconductor and/or dielectric thin film for a transistor, capacitor, diode and/or resistor in such a tag, backplane, driver, sensor, device and/or circuit.

Example 1

Synthesis of an NHC—Pd Metal Complex and Bonding of the NHC—Pd Complex to Silica Gel as a Support Synthesis of bis[N-3-(3-trimethoxysilylpropyl)-3-methylimidazol-2-ylidene]-dichloropalladium (II)

(3-chloropropyl)trimethoxysilane (24.23 g) is added to a solution of 1-methylimidazole (10.12 g) in absolute toluene (120 mL), in a two necked 250 mL Schlenk flask. The system was evacuated and refilled with argon three times, and refluxed for 24 hours under an argon atmosphere. The resulting two phase reaction mixture was then allowed to cool to room temperature, and the organic layer was separated from the ionic liquid (IL) layer. The resulting pale yellow IL layer was then thoroughly washed with dry Et$_2$O (5×20 mL) and dried under vacuum for 12 hours at room temperature. The resulting ionic liquid contained 30% N-3-(3-trimethoxysilylpropyl)-3-methylimidazolium chloride and weighed 10.3 g.

The N-3-(3-trimethoxysilylpropyl)-3-methylimidazolium chloride was extracted and 150 mg of 0.53 mmol solution was added to Ag$_2$O (63 mg, 0.27 mmol) in 10 mL of methylene chloride. The solution was stirred at room temperature for 6 hours and then filtered to obtain a colorless solution. The solvent was removed in vacuo to yield a pale yellow oil weighing 190 mg that contained 90% [(NHC)$_2$Ag]$^+$[AgCl$_2$].

The [(NHC)$_2$Ag]$^+$[AgCl$_2$]$^-$ (190 mg, 0.38 mmol) was added to 10 mL of CH$_2$Cl$_2$ with (CH$_3$CN)$_2$PdCl$_2$ (100 mg, 0.38 mmol). The mixture was stirred for 12 hours at room temperature. A white precipitate (AgCl) was filtered to yield a pale yellow solution. The solvent was removed in vacuo to yield 125 mg of a pale yellow oil. The oil was then precipitated with THF to yield [N-3-(3-trimethoxysilylpropyl)-3-methylimidazol-2-ylidene]-dichloropalladium (II).

Synthesis of Silica Gel Pd—NHC Complexes

Mesoporous silica gel (average pore diameter 60 Å) was activated by stirring in concentrated hydrochloric acid (6 M)

for 24 h and then washed thoroughly with distilled water until neutral and dried at 90° C. before undergoing chemical surface modification. A CHCl$_3$ solution of bis[N-3-(3-trimethoxysilylpropyl)-3-methylimidazol-2-ylidene]dichloropalladium (II) (containing 0.38 mmol of Pd—NHC complex) was added to a suspension of activated silica gel (10 g) in dry CHCl$_3$ (50 mL), under argon atmosphere. The resulting mixture was refluxed for 24 h. After cooling, the solid materials were filtered off and the residue was washed with hot CHCl$_3$ for 12 h in a continuous extraction apparatus (Soxhlet) and then dried in oven at 90° C. overnight to give N-heterocyclic carbene palladium complex immobilized on silica gel.

Example 2

Synthesis of Polysilane by Catalysis Using NHC—Pd Complexes

Tetrasilane in cyclohexane with a mass-loading of 20% (300 mg) was added to a 4 mL amber vial along with 100 ppm of the NHC—Pd complex [N-3-(3-trimethoxysilylpropyl)-3-methylimidazol-2-ylidene]dichloropalladium (II) under an inert atmosphere, and this reaction mixture was allowed to stir for 12 hours in the loosely capped vial. Then, the reaction was quenched with 2 g of distilled cyclohexane, and the resulting mixture transferred to a 40 mL amber vial (equipped with a stir bar) and further diluted with 5 g of cyclohexane. After 30 min of stirring, insoluble materials were allowed to settle for about 15 min, and the mixture then filtered through a short plug of Celite (primed with distilled cyclohexane), ensuring that the NHC—Pd catalyst stayed on top of the filter bed. The solution was then transferred to a Schlenk tube and the volatile materials removed by applying high vacuum (<~300 mTorr) for about 2 hours. This drying step should reduce the tetrasilane (monomer) content in the resulting product to <10% (monomer content checked by GPC). If the tetrasilane content exceeds 10% of the reaction mixture, the solution should be further dried under vacuum. The overall procedure typically produces polytetrasilane in ~60-80% yield. The product material may be stored as a 20 wt. % solution in dried, distilled cis-decalin.

Example 3

Synthesis of Polysilanes by Heterogeneous Catalysis Using Silica Gel NHC—Pd Complexes Tetrasilane (300 mg) was added to a 4 mL amber vial containing 50 mg of silica gel NHC—Pd complexes (0.066 mol of NHC—Pd complex per mg of silica) under an inert atmosphere, and this reaction mixture was allowed to stir for 12 hours in the loosely capped vial. Then, the reaction was quenched with 2 g of distilled cyclohexane, and the resulting mixture transferred to a 40 mL amber vial (equipped with a stir bar) and further diluted with 5 g of cyclohexane. After 30 min of stirring, insoluble materials were allowed to settle for about 15 min, and the mixture then filtered through a short plug of Celite (primed with distilled cyclohexane), ensuring that the silica gel NHC—Pd complexes stayed on top of the filter bed. The solution was then transferred to a Schlenk tube and the volatile materials removed by applying high vacuum (<~300 mTorr) for about 2 hours. This drying step should reduce the tetrasilane (monomer) content in the resulting product to <10% (monomer content may be checked by GPC). If the tetrasilane content exceeds 10% of the reaction mixture, the solution should be further dried under vacuum. The overall procedure typically produces polytetrasilane in ~60-80% yield. The product material may be stored as a 20 wt. % solution in dried, distilled cis-decalin.

Figure 4:
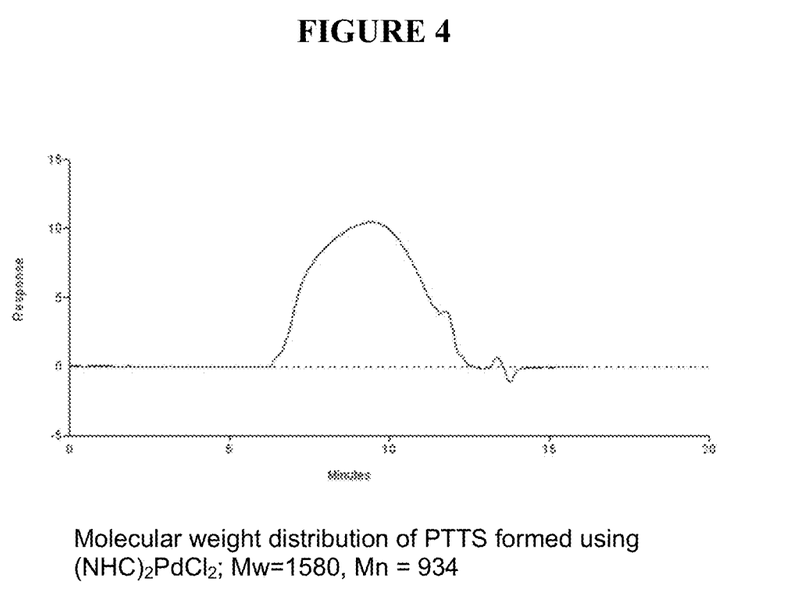
FIG. 4 is a gel permeation chromatograph (GPC) of the polysilane product formed using an N-heterocyclic carbene-palladium complex as a catalyst according to one example of the present method.

FIG. 4 shows gas phase chromatography data of the molecular weight distribution of the polysilanes produced by the silica gel NHC/metal polymerization reaction described above. The resulting polysilanes had a weight average molecular weight (Mw) of 1580, a number average molecular weight (Mn) of 934, and a polydispersity index (PDI) of 1.69.

Polysilanes from this process were formulated into silane ink compositions (in 80:20 cyclohexane:cyclooctane, with 10-30% mass loading). All ink compositions exhibited good spincoating characteristics on silicon wafers with UV cure. The polysilane coated wafers sheeted in <1 min upon HF dip and etched in tetramethylammonium hydroxide (TMAH) after laser crystallization. The films were prepared identically, in accordance with the UV-spincoating and curing procedures described in U.S. patent application Ser. No. 10/789,274, filed on Feb. 27, 2004. The metal (Pd) content of the films is remarkably low (<0.02 ppm), which is sufficiently low for applications that require highly pure silicon films, such as solar applications. The carbon content and the oxygen content are each less than 0.05 at %, a level suitable for electronic-grade films. Nitrogen impurities are at a level of about 10 ppm or less, and typical metal impurities (e.g., Na, K, Al, Mg) are less than 0.01 ppm.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of making an oligosilane or polysilane, comprising:
    a) combining (i) one or more silane compounds of the formula $A_nH_jR_k$ with (ii) a catalyst selected from the group consisting of N-heterocyclic carbenes, N-heterocyclic silylenes, N-heterocyclic germylenes, N-heterocyclic carbene-metal complexes, N-heterocyclic silylene-metal complexes, N-heterocyclic germylene-metal complexes, and supported versions thereof to form the oligosilane or polysilane, where each instance of A is Si; n is an integer of at least 1; j is an integer of at least 2; when n is odd, j+k is an integer of from n+1 to 2n+2; when n is even, j+k is an integer from n to 2n+2; and each instance of R is independently an aryl group, a halogen atom, or a pseudohalide; and
    b) removing said catalyst from said oligosilane or polysilane.

2. The method of claim 1, wherein the catalyst comprises an N-heterocyclic silylene.

3. The method of claim 1, wherein the catalyst comprises an N-heterocyclic carbene-metal complex or an N-heterocyclic silylene-metal complex.

4. The method of claim 2, wherein the catalyst comprises an N,N-disubstituted imidazol-2-silylene or an imidazolin-2-silylene.

5. The method of claim 3, wherein the catalyst comprises Pd and an N,N-disubstituted imidazol-2-ylidene or an imidazolin-2-ylidene.

6. The method of claim 3, wherein the catalyst comprises (i) a metal selected from the group consisting of Sc, Ti, V, Cr, Mn, Fe, Co, Zn, Y, Zr, Nb, Mo, Cd, Lu, Hf, Ta, W, Re, Os, Ir, Hg, Ag, Cu, Au, Pd, Rh, Ru, Pt and Ni, and (ii) at least one N-heterocyclic carbene ligand.

7. The method of claim 6, wherein the catalyst comprises a complex of the formula $[M(NHC)_xX_y]_z$, where M is selected from the group consisting of Ag, Cu, Au, Pd, Rh, Ru, Pt, and Ni, NHC is an N-heterocyclic carbene, x=1 or 2, y=1 or 2, z is 1 or 2, and each instance of X is independently a halide, carboxy, hydride, or a substituted or unsubstituted alkyl, allyl, aryl, aralkyl, alkoxy, aryloxy, aralkoxy, beta-diketonate, diarylamino, dialkylamino, alkylthio, arylthio, boryl, Cp, or Cp* ligand.

8. The method of claim 1, wherein the catalyst is anchored to a stationary phase.

9. A method of making an oligosilane, polysilane, oligosilagermane, polysilagermane, oligogermane and/or polygermane, comprising:
   a) combining (i) one or more silane, germane or silagermane compounds of the formula $A_nH_jR_k$ with (ii) a catalyst selected from the group consisting of $TmI_2$, $DyI_2$, $YbCl_2$, $YbI_2$, $EuI_2$ or $NdI_2$ to form the oligosilane or polysilane, where each instance of A is independently Si or Ge; n is an integer of at least 1; j is an integer of at least 2; when n is odd, j+k is an integer of from n+1 to 2n+2; when n is even, j+k is an integer from n to 2n+2; and each instance of R is independently an aryl group, a halogen atom, or a pseudohalide; and
   b) removing said catalyst from said oligosilane, polysilane, oligosilagermane, polysilagermane, oligogermane and/ or polygermane.

10. The method of claim 9, wherein the catalyst comprises $DyI_2$.

11. The method of claim 7, where M is selected from the group consisting of Pd, Pt and Ni and each instance of X is independently a halide.

12. The method of claim 9, wherein the catalyst comprises $NdI_2$.

13. The method of claim 1, wherein the one or more silane compounds and the catalyst are combined in a solvent, and the solvent is selected from the group consisting of $C_5$-$C_{10}$ alkanes, $C_5$-$C_{10}$ cycloalkanes, and mixtures thereof.

14. The method of claim 13, wherein the one or more silane compounds are present in the solvent in an amount of 1-90% by weight.

15. The method of claim 14, wherein the catalyst is present in the solvent in an amount of 0.001 to 1 mmol per mole of silane compounds present in the solvent.

16. The method of claim 1, wherein the one or more silane compounds comprises trisilane, tetrasilane or neopentasilane.

17. The method of claim 16, wherein the one or more silane compounds further comprise cyclopentasilane.

18. The method of claim 1, wherein removing said catalyst from said oligosilane or polysilane comprises filtering the combined catalyst and oligosilane or polysilane.

19. The method of claim 1, wherein k=0, and the oligosilane or polysilane consists essentially of Si atoms and H atoms.

20. The method of claim 1, wherein k≥1, and
   a) when R is an aryl group, the method further comprises replacing the aryl group with a halogen or pseudohalide; and
   b) when (i) R is a halogen atom or a pseudohalide, or (ii) the oligosilane or polysilane includes a halogen atom or a pseudohalide, the method further comprises reducing the halogen atom or pseudohalide with a hydride source to form an oligosilane or polysilane consisting essentially of Si atoms and H atoms.

21. A method of making an ink composition, comprising the step of mixing:
   a) the oligosilane(s) or polysilane(s) made by the method of claim 1;
   b) and a solvent in which the oligosilane(s) or polysilane(s) is soluble.

22. A method of forming a semiconductor film from the ink composition made by the method of claim 21, comprising:
   a) coating or printing said ink composition onto a substrate;
   b) heating said coated or printed ink composition sufficiently to form an amorphous, hydrogenated semiconductor; and
   c) optionally annealing and/or irradiating said amorphous, hydrogenated semiconductor sufficiently to at least partially crystallize and/or reduce a hydrogen content of said amorphous, hydrogenated semiconductor and form said semiconductor film.

23. A method of making a thin film transistor, capacitor, diode and/or resistor, comprising forming a semiconductor film by the method of claim 22, and forming one or more conductive and/or insulating films in physical proximity to the semiconductor film.

24. The method of claim 9, wherein the catalyst comprises $TmI_2$.

25. The method of claim 9, wherein the lanthanide metal catalyst comprises $TmI_2$, $DyI_2$.

26. The method of claim 9, wherein the one or more silane, germane or silagermane compounds comprises a silane of the formula $Si_nH_jR_k$.

27. The method of claim 9, wherein the one or more silane, germane or silagermane compounds and the catalyst are combined in a solvent, and the solvent is selected from the group consisting of $C_5$-$C_{10}$ alkanes, $C_5$-$C_{10}$ cycloalkanes, and mixtures thereof.

28. The method of claim 27, wherein the catalyst is present in the solvent in an amount of 0.001 to 1 mmol per mole of silane, germane or silagermane compounds present in the solvent.

29. The method of claim 9, wherein k=0, and the oligosilane, polysilane, oligosilagermane, polysilagermane, oligogermane and/or polygermane consists essentially of A atoms and H atoms.

30. The method of claim 9, wherein the one or more silane, germane or silagermane compounds comprises trisilane, tetrasilane or neopentasilane.

31. The method of claim 9, wherein removing said catalyst from said oligosilane, polysilane, oligosilagermane, polysilagermane, oligogermane and/or polygermane comprises filtering the combined catalyst and oligosilane, polysilane, oligosilagermane, polysilagermane, oligogermane and/or polygermane.

* * * * *